(12) United States Patent
Legein et al.

(10) Patent No.: US 10,535,500 B2
(45) Date of Patent: Jan. 14, 2020

(54) PLASMA DIFFUSER METHOD AND APPARATUS

(71) Applicant: Europlasma NV, Oudenaarde (BE)

(72) Inventors: Filip Legein, Oudenaarde (BE); Eva Rogge, Oudenaarde (BE); Guy Feys, Oudenaarde (BE)

(73) Assignee: Europlasma NV, Oudenaarde (BE)

( * ) Notice: Subject to any disclaimer, the term of this patent is extended or adjusted under 35 U.S.C. 154(b) by 21 days.

(21) Appl. No.: 15/306,147

(22) PCT Filed: Apr. 22, 2015

(86) PCT No.: PCT/EP2015/058728
§ 371 (c)(1),
(2) Date: Oct. 24, 2016

(87) PCT Pub. No.: WO2015/162183
PCT Pub. Date: Oct. 29, 2015

(65) Prior Publication Data
US 2017/0047201 A1 Feb. 16, 2017

(30) Foreign Application Priority Data
Apr. 22, 2014 (EP) .................................. 14165491

(51) Int. Cl.
| C23C 16/452 | (2006.01) |
| H01J 37/32 | (2006.01) |
| D06M 10/02 | (2006.01) |
| D06M 10/10 | (2006.01) |
| D06M 14/32 | (2006.01) |
| D06M 15/277 | (2006.01) |

(52) U.S. Cl.
CPC ..... H01J 37/32082 (2013.01); D06M 10/025 (2013.01); D06M 10/10 (2013.01); D06M 14/32 (2013.01); D06M 15/277 (2013.01); H01J 37/32623 (2013.01); H01J 37/32816 (2013.01); H01J 2237/3323 (2013.01)

(58) Field of Classification Search
CPC ..... C23C 16/452; C23C 16/50; C23C 16/505; H05H 1/24
See application file for complete search history.

(56) References Cited

U.S. PATENT DOCUMENTS

| 4,096,315 A | 6/1978 | Kubacki |
| 4,389,973 A | 6/1983 | Suntola |
| 4,477,575 A * | 10/1984 | Vogel .................. B01D 39/2017 210/509 |
| 4,595,570 A * | 6/1986 | Fukuta ..................... B01J 3/006 118/50.1 |
| 4,686,113 A | 8/1987 | Delfino |
| 4,737,379 A | 4/1988 | Hudgens |
| 5,105,761 A * | 4/1992 | Charlet ................ H01J 37/3244 118/719 |
| 5,224,926 A * | 7/1993 | Gorsuch ............. A61B 5/14528 604/6.04 |
| 2003/0019589 A1* | 1/2003 | Colson ..................... E06B 9/262 160/84.06 |
| 2006/0236934 A1* | 10/2006 | Choi ...................... C23C 16/345 118/723 R |
| 2006/0251905 A1* | 11/2006 | Arakawa ................. B32B 27/08 428/429 |
| 2007/0026540 A1* | 2/2007 | Nooten ................. C23C 16/045 438/5 |
| 2009/0255470 A1 | 10/2009 | Soininen |
| 2010/0166955 A1 | 7/2010 | Becker |
| 2011/0045238 A1* | 2/2011 | Zeininger ............... B41N 1/247 428/137 |
| 2012/0003397 A1* | 1/2012 | Reniers ..................... C23C 4/02 427/576 |
| 2012/0047976 A1* | 3/2012 | Vanderhye ............. B01D 53/62 71/61 |
| 2012/0211082 A1* | 8/2012 | Akiyama ............... C07F 9/5325 136/263 |
| 2015/0000597 A1* | 1/2015 | Nambiar ........... C23C 16/45565 118/723 R |

FOREIGN PATENT DOCUMENTS

| EP | 1933608 A1 | 6/2008 |
| GB | 2220006 A | 12/1989 |

OTHER PUBLICATIONS

Grundmann, S., et al., "Sensitivity of an assymetric 3D diffuser to plasma-actuator induced inlet condition perturbations". Exp. Fluids (2011) 50:217-231.*
Pugazenthi, R.S., et al., "Design and Performance Analysis of a Supersonic Diffuser for Plasma Wind Tunnel". International Scholarly and Scientific Research & Innovation 5(8) 2011, p. 1682-1687.*
Manuel, O., et al., "The Sun is a Plasma Diffuser that Sorts Atoms by Mass". Physics of Atomic Nuclei 69, No. 11, pp. 1847-1856 (2006).*
Yasuda and Hsu, "Some Aspects of Plasma Polymerization Investigated by Pulsed R.F. Discharge", Journal of Polymer Science, Polymer Chemistry Edition, vol. 15, 81-97 (1977).
Yasuda and Hsu, "Some Aspects of Plasma Polymerization of Fluorine-Containing Organic Compounds", Journal of Polymer Science, vol. 15, 2411-2425 (1977).
Panchalingham V., "Pulsed Plasma Discharge Polymer Coatings", ASAIO Journal, 1993, M305-M309.
Hynes, A.M., "Plasma Polymerization of Trifluoromethyl-Substituted Perfluorocyclohexane Monomers", Macromolecules 1996, 29, 18-21.
Hynes, A.M., "Pulsed Plasma Polymerization of Perfluorocyclohexane", Macromolecules 1996, 29, 4220-4225.

* cited by examiner

*Primary Examiner* — Bret P Chen
(74) *Attorney, Agent, or Firm* — James Creighton Wray

(57) ABSTRACT

A method is provided for at least partially preventing discolouration of a substrate by a plasma coating process, by diffusing a plasma prior to and/or during depositing of said plasma on said substrate to form a coating. Also provided is a plasma coating apparatus comprising a plasma diffuser for homogenizing a plasma density nearby a substrate to be coated.

17 Claims, 17 Drawing Sheets

PLASMA DIFFUSER METHOD AND APPARATUS

This application claims the benefit of European Application No. 14165491.3 filed Apr. 22, 2014, and PCT/EP2015/058728 filed Apr. 22, 2015, International Publication No. WO2015/162182A1, and the amended sheets from the IPRP, which are hereby incorporated by reference in their entirety as if fully set forth herein.

TECHNICAL FIELD

The present invention relates to improved ways to deposit plasma coatings, preferably by plasma polymerization and preferably at low pressure, onto substrates sensitive to colour change.

BACKGROUND

Plasma coatings, and low pressure plasma coatings in particular, are today widely used to add functionalities to substrates, such as hydrophilic, hydrophobic, oleophobic, scratch resistant properties and/or barrier coatings. On some substrates, especially dark substrates, such as black, grey, dark blue, dark green, dark purple substrates, but also substrates having a high gloss surface or a low surface roughness (e.g. soft feel surfaces or polished surfaces), it is an unwanted phenomenon that these substrates tend to become darker in colour after treatment. Sometimes a rainbow-like discolouration becomes visible.

In those situations where the substrate is a material or object that is as such used by the end customer, it is unwanted that this colour change, whether it is a darkening of the colour or the appearance of a rainbow effect, becomes visible to the end user.

In order to solve this issue, applicant has invented a so-called "plasma diffuser", which allows to deposit nano-coatings with highly reduced to none discolouration effect while at the same time the performance of the substrate is not negatively influenced.

This invention allows to treat products at the end of the manufacture line as well as during manufacture.

Applicant noticed that the effect of discolouration is the strongest for halogen containing coatings, such as fluoro-containing coatings used to impart hydrophobic and/or oleophobic properties to substrates.

The effect is the most pronounced on black, dark blue, dark green and dark grey surfaces. The effect is pronounced on high gloss, high reflective surfaces as well, and also on surfaces which have a rather smooth surface on macroscopic level, like flat plastic parts, such as the casing of (hand held) electronic devices, or sheets or garments made of textile.

Applicant noticed that discolouration is more pronounced for batch processes, during which substrates are coated in a static way. In static processes, sheets of textiles and garments are for instance fixed in a vertical position, or plastic parts and electronics can be coated in a tray-wise system with horizontal position.

In the beginning of the development of plasma processing, the used systems were limited in volume, for example less than 10 litres, even less than 5 litres or less than 1 litre. Such small systems have been designed mainly for use in the semiconductor industry, with a good plasma uniformity and density distribution because of the limited size of the system, as well as well controllable process parameters. The design of the systems was optimized and often complex for treating smaller and/or limited amounts of products which high precision. Discolouration was not an issue in this type of equipment since products to be treated are small and so is the system.

Yasuda, H. and Hsu, T. describe the use of a cylindrical glass chamber of 4 mm diameter and 10 cm length, representing a chamber volume of approx. 1.26 $cm^3$, or 0.00126 l ("Some Aspects of Plasma Polymerization Investigated by Pulsed R.F. Discharge", Journal of Polymer Science: Polymer Chemistry Edition, vol. 15, 81-97 (1977); and "Some Aspects of Plasma Polymerization of Fluorine-Containing Organic Compounds", Journal of Polymer Science: Polymer Chemistry Edition, vol. 15, 2411-2425 (1977)).

Panchalingam V. et al. describe the use of a cylindrical glass chamber of 10 cm diameter and 30.5 cm length, representing a chamber volume of approx. 2.4 litres ("Pulsed Plasma discharge Polymer Coatings", ASAIO Journal, 1993, M305-M309).

Hynes, A. M et al. describe the use of a cylindrical glass reactor of 5 cm diameter and a volume of 490 $cm^3$ (0.49 litres) ("Plasma Polymerization of trifluoromethyl-substituted Perfluorocyclohexane Monomers", Macromolecules 1996, 29, 18-21, and "Pulsed Plasma Polymerization of Perfluorocyclohexane", Macromolecules 1996, 29, 4220-4225).

U.S. Pat. No. 4,737,379 (Energy Conversion Devices Inc.) describes for example a small plasma equipment having a tubular chamber or vessel, used to deposit hard alloy coating free of hydrogen, a.o. for passivation purposes, on for example semiconductors.

U.S. Pat. No. 4,686,113 (Fairchild Semiconductor Corporation) describes a plasma equipment consisting of a quartz tube as chamber for inductively coating silicon substrates, e.g. used in semiconductor applications.

GB Patent application No. 2,220,006 (Philips Electronic Associated) describes the use of the plasma chamber for coating or etching substrates, e.g. semiconductor bodies. In the description it is mentioned that the electrodes are approx. 15 cm×15 cm and the samples treated in the examples are of a 100 mm diameter, indicating a small system for treating small objects.

Other examples of chambers used at reduced pressure are chambers for atomic layer deposition processes (ALD). These processes are very complex, and several prior art documents relate to the design of these ALD vacuum chambers in order to guarantee a good process. Typically these systems have a limited volume since larger systems lead to less controllable processing parameters and thus to less performant treatments.

For example, US Patent application No. 2009/255,470 (Beneq Oy) describes an ALD reactor for treating small objects with an ALD process, where the design is chosen in a way that gas may enter the reaction chamber through all walls to optimize the gas distribution. Page 3 indicates a chamber with an inner diameter of 230 mm, for treating one or more silicon samples having a diameter of 200 mm.

U.S. Pat. No. 4,389,973 (Oy Lohja AB) describes multiple complex designs for an ALD reactor in order to optimize the process and the resulting coating. The process uses gas phase diffusion barriers in order to separate the single reaction steps of the ALD process. Again, the system is developed for treating a limited number of samples having limited dimensions.

US Patent application No. 2010/166,955 (Cambridge NanoTech Inc.) describes an apparatus having one or more smaller rectangular reaction chambers vertically positioned on top of each other, wherein one substrate is placed in one reaction chamber at a time. Typical chambers have a volume of 20 litres, and are used to deposit thin films by ALD (atomic layer deposition) or ALE (atomic layer epitaxy) onto substrates for use in LCDs. The chamber design is optimized to obtain a substantially uniform flow direction and velocity. The design is complex and the dimensions of the substrates to be coated, as well as the throughput, is limited.

EP Patent application No. 1,933,608 (Tonen Chemical Corporation) describes a method and apparatus for plasma-treating a porous body by either blowing a plasma gas to the porous body or by sucking a plasma through the porous body or a combination of both. However, this does not guarantee a coating with a uniform spread as is desired. Especially when applying this technique to nonporous bodies, this will create an asymmetrical coating, but also when applied to porous bodies, as the delivery of the plasma gas will still differ from the side from which it is supplied to the opposing side of the porous body. Furthermore, the substrate is supported by a porous body on one side. While allowing some passage of the plasma gas, this will nonetheless to some degree restrict the access of the plasma gas to the supported side of the substrate because of the contact between the porous body and the substrate and create a non-uniform coating on said side.

U.S. Pat. No. 4,096,315 (NASA) describes a method for coating an optical plastic substrate with an abrasion resistant coating, deposited by a low temperature plasma polymerization process. Again, there is no mention of securing a uniform spread over the surface of the substrate. No discolouration is claimed to be witnessed when stored at temperatures of 170° F. (76.67° C.) for 168 hours. However it is to be noted that this method focuses on coatings for optical plastic substrates, in particular lenses for cameras, projectors, telescopes and other optical instruments, not for darker substrates, hence a transparent coating is needed on the substrates of U.S. Pat. No. 4,096,315. The problem the current invention aims to solve, poses itself primarily on darker substrates and therefor the claim of the patent of NASA that there was no evidence of discolouration, is to be taken in perspective of this context. Furthermore, the U.S. Pat. No. 4,096,315 concerns thin coatings with a preferable thickness of 20 nm. The applicant has noticed that, the thicker the applied coating is, the more pronounced the discolouration becomes, thereby becoming a very real problem in the desired range of coating thickness of the applicant.

The present invention relates to reaction chambers, for example for plasma processing, having a larger volume so as to treat multiple samples in a single processing run. This allows to have a high throughput combined with excellent performance of the treatment. The present invention contributes to improvement of the process in terms of visual effect, while at the same time the other characteristics of the treatment, e.g. a plasma coating, are maintained.

Nowadays, one of the critical parameters in adopting a technology is the throughput, the number of pieces that can be treated in one day, one week, one month or one year. To answer the increased throughput requests of the customers in different markets, larger systems have been constructed. Small R&D systems of less than 1 litre of useful area have been scaled up by extensive research over the years, to systems of several hundreds to thousands of litres. For example, the applicant has developed batch systems having a volume of 500 litres—wherein for example up to 300 smartphones can be treated in a single batch—and even larger, up to 10 000 litres for roll-to-roll systems used for coating rolls of textile.

The main challenge for these large production scale machines is how the plasma density or the plasma intensity can be distributed evenly and homogeneously over the complete useful area. It is well known that the plasma uniformity and plasma distribution of such large systems is less that in small R&D systems. Research has been done to optimize the uniformity, but it is very difficult to even impossible to have a 100% uniform plasma distribution because of the fact that many components of the equipment are implemented in the chamber: pump openings, gas inlets, trays/hangers, electrodes, etc.

Consequently, discolouration on substrates which are dark and/or are having a high gloss and/or a smooth surface, did show up due to uneven plasma uniformity inside the chamber. Optimization of the plasma parameters did not provide solutions for this discolouration issue.

Discolouration limits the applications and markets where the plasma process may be used for added value to products. The use of plasma coatings is limited especially for use on finished good level since these products are meant for direct sales to customers. Of course customers are not likely to buy items that have discolouration, a non-homogeneous colour or a rainbow-like shine.

Examples of finished goods where the use of plasma coatings might be limited due to discolouration issues are hand held electronic devices in the retail market, e.g. smartphones, mobile phones, tablets, personal digital assistants (PDAs), navigation systems, speakers, heading airs, headsets, and so on. Other examples are textiles for garments and clothing, such as sports and outdoor clothing, shoes and equipment, or shoes, clothing and equipment for use in personal protective equipment (PPE)—medical applications, cleanroom, firemen, policemen, postmen, etc.

SUMMARY OF THE INVENTION

The applicant has surprisingly found a way to reduce the discolouration to a large extent, and in some cases no discolouration is visible after treatment. The discolouration reduction is made possible by using a so-called "plasma diffuser", where a diffuser material is placed in the area between the products or objects and at least the electrode or electrodes, for example the or each radiofrequency (RF) electrode. The diffuser material diffuses the plasma, leading to a more uniform and homogeneous distribution, and surprisingly to a reduction of the discolouration issue.

Therefore, the present invention relates to a method for at least partially preventing discolouration of a substrate by a plasma coating process, by diffusing a plasma prior to and/or during depositing of said plasma on said substrate to form a coating.

In an embodiment, said substrate is pre-treated by a pre-treatment plasma, wherein said pre-treatment plasma is diffused prior to and/or during reaction of said pre-treatment plasma with said substrate, thereby preferably cleaning, activating and/or etching said substrate.

The present invention further relates to a method for pre-treating a substrate by a pre-treatment plasma, preferably prior to applying a method for plasma coating a substrate, by diffusing said pre-treatment plasma prior to and/or during reaction of said pre-treatment plasma with said substrate, thereby preferably cleaning, activating and/or etching said substrate.

The present invention also relates to a plasma coating apparatus suitable for, preferably arranged for, executing a method according to the present invention. Therefore, the present invention relates to a plasma coating apparatus for applying a plasma coating to a substrate, preferably at low pressure and preferably a plasma polymerization coating, said apparatus comprising a plasma chamber which comprises a grounded (M) electrode, a radiofrequency (RF) electrode and a plasma diffuser for homogenizing a plasma density nearby said substrate, preferably said plasma diffuser positioned between said electrodes.

The present invention further relates to a plasma diffuser suitable, preferably arranged, for use in a plasma coating apparatus according to the present invention, use of an apparatus according to the present invention for executing a method according to the present invention and to a product, preferably comprising a textile, treated with a method and/or an apparatus according to the present invention.

In an embodiment, said plasma comprises monomers and preferably wherein said coating is a polymer coating.

In an embodiment, said plasma is provided at low pressure, preferably at a pressure lower than atmospheric pressure, more preferably lower than 1000 mTorr and/or preferably higher than 5 mTorr.

In an embodiment, said plasma is diffused by a plasma diffusing material, preferably comprising the steps of removing, placing, replacing, and/or repositioning said diffusing material.

In an embodiment, the coating performance in terms of oil repellency, spray test and wash-ability is not negatively influenced.

In an embodiment, said substrate is coated in a plasma coating apparatus comprising a plasma chamber which comprises a grounded (M) electrode, a radiofrequency (RF) electrode and a plasma diffuser, preferably comprising one or more plasma diffuser materials positioned between said electrodes, for homogenizing a plasma density nearby said substrate to reduce discolouration of said substrate after processing, the plasma diffuser materials preferably in the form of a sheet, which may be flat, curved or folded.

In an embodiment, one or a combination of the following features is present:
  plasma diffuser material is placed between the substrate or substrates to be coated and the radiofrequency electrode;
  plasma diffuser material is placed between the substrate or substrates to be coated and the grounded electrode;
  plasma diffuser material is placed between the substrate or substrate to be coated and the grounded electrode, and between the substrate or substrates to be coated and the radiofrequency electrode;
  plasma diffuser material is placed at least at one more side of the substrate, facing a wall of the plasma chamber so as to form a colloidal plasma diffuser; and/or
  a sheet of plasma diffuser material is wrapped cylindrically around the substrate or substrates to be coated.

In an embodiment, the plasma diffusion is performed in a selective way, such as by removing or adding diffuser material at areas to reduce or increase the plasma diffusion accordingly.

In an embodiment, said plasma diffuser comprises a plasma diffuser material placed in said plasma chamber, preferably said plasma diffuser material in the form of a sheet.

In an embodiment, the plasma diffuser material comprises an open cell polymer structure, such as a nonwoven, a woven, a knit, a membrane, a film or a foil; and/or an open cell metal structure, such as a mesh structure.

In an embodiment, the plasma diffuser is placed in the plasma chamber without the use of a frame or with support of a frame.

In an embodiment, the plasma diffuser comprises opening means, such as a zipper, buttons, Velcro strips or tape.

Further, the applicant has discovered that the use of a plasma diffuser is not limited to one plasma chamber, or to one set of plasma processes or low pressure plasma processes. The plasma diffuser may be used in smaller systems, but is especially suited for the larger systems where the plasma diffuser inside the plasma chamber is less uniform.

The plasma diffuser may be used for a wide range of process parameters, which makes the plasma diffuser useful for a wide range of processes, systems and substrates. Examples of process parameters are, without implying any limitation:
  lower and higher flows of monomer, e.g. from 1 sccm to 500 sccm, such as from 5 sccm to 150 sccm;
  power applied in pulsed mode or in continuous wave mode, e.g. when applied in pulsed power mode, the pulse repetition frequency may be from 100 Hz to 10 kHz having a duty cycle from approximately 0.05 to 50%, with the optimum parameters being dependent on the monomer used;
  lower and higher base pressure and work pressure, e.g. base pressures from 5 mTorr to 200 mTorr and work pressures from 10 mTorr to 500 mTorr;
  short and long processes, e.g. from 5 seconds to 120 minutes.

A person skilled in the art would not use a plasma diffuser to solve the discolouration issue, since he would expect a reduction in the performance level since the diffuser is shielding to some extent the exposure of the products to the plasma. If a reduction in the performance—coating thickness, oil repellency, water contact angle, spray testing, washability, and so on—is to be expected, one would not use the plasma diffuser since it is key to maintain the performance whilst solving the discolouration issue.

Surprisingly, the applicant has noticed that despite the diffusion of the plasma in the plasma chamber, the performances of the plasma treatment, such as—in case of water and/or oil repellent coatings—oil repellency level, water contact angle and washing performance, are maintained at the same level. This is an unexpected advantage of the plasma diffuser, since a person skilled in the art would have expected the opposite, namely a decrease in performance due to some degree of shielding caused by placing the diffuser material between at least the RF electrode or electrodes and the products to be treated.

SHORT DESCRIPTION OF THE FIGURES

FIGS. 3A-33 illustrate embodiments according to the present invention whereby diffuser material is placed between a RF electrode and the substrate or substrates to be coated and/or a tray for holding the substrate or substrates and, consequently, simultaneously or alternating, between a grounded electrode and the substrate or substrates to be coated and/or a tray for holding the substrate or substrates.

FIGS. 4A-4F illustrate embodiments according to the present invention whereby diffuser material is positioned at least partially between the electrodes, arranged in a horizontal substantially parallel electrode set-up, and the substrate or substrates to be coated and/or a tray for holding the substrate or substrates, and said diffuser material is further positioned at least partially around said substrate and/or tray in a direction substantially perpendicular to said electrodes.

Figure 5A:
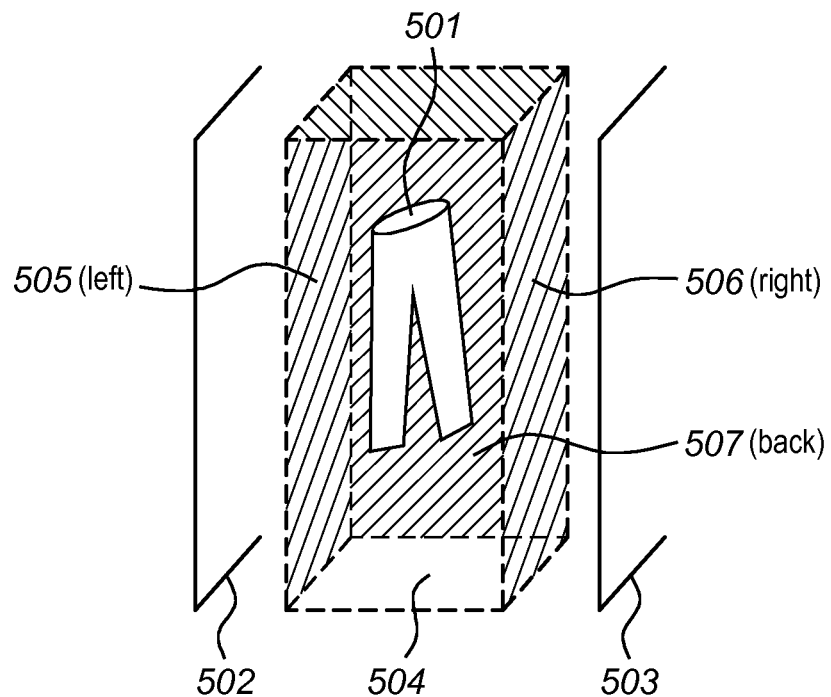
Figure 5B:
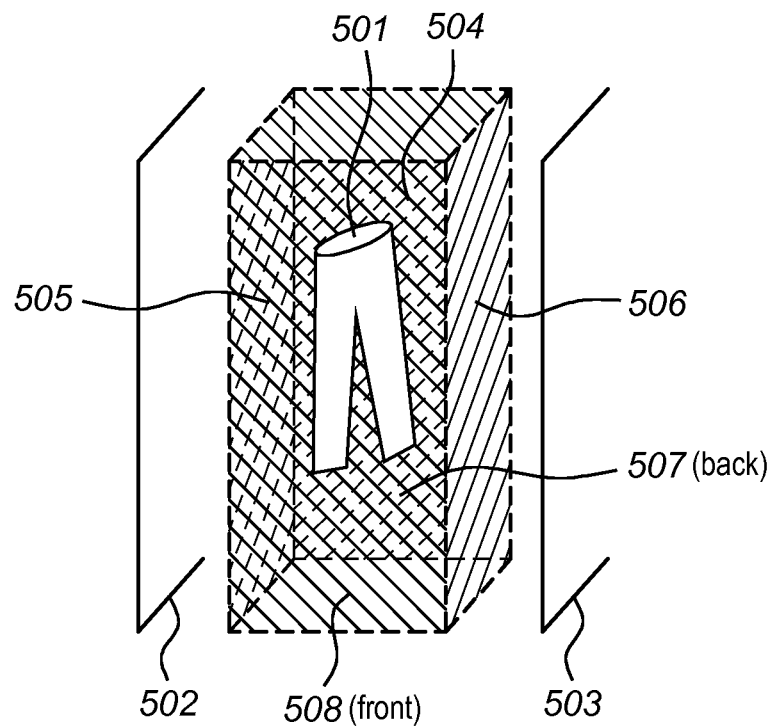
Figure 5C:
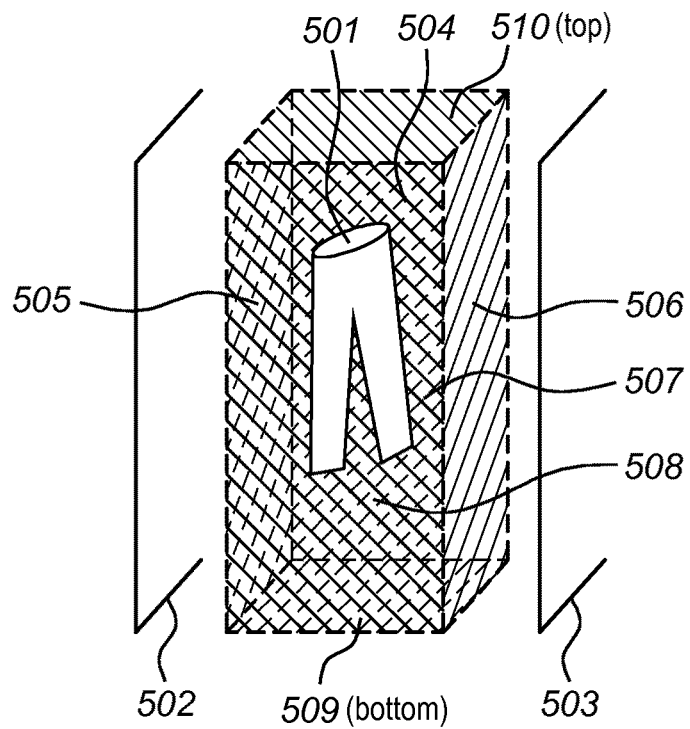

FIGS. 5A-5C illustrate embodiments according to the present invention whereby diffuser material is positioned at least partially between the electrodes, arranged in a vertical substantially parallel electrode set-up, and the substrate or substrates to be coated, and said diffuser material is further positioned at least partially around said substrate in a direction substantially perpendicular to said electrodes.

FIGS. 6A-6D illustrate embodiments according to the present invention whereby diffuser material is positioned at least partially around the substrate or substrates to be coated and/or a tray for holding the substrate or substrates in a cylindrical way.

Figure 7A:
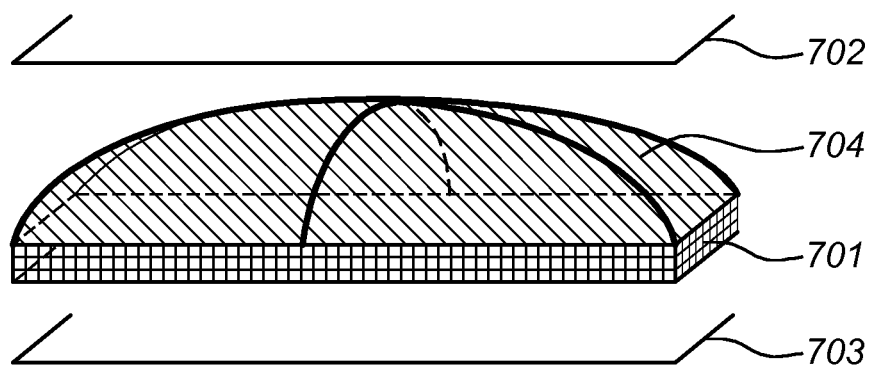
Figure 7B:
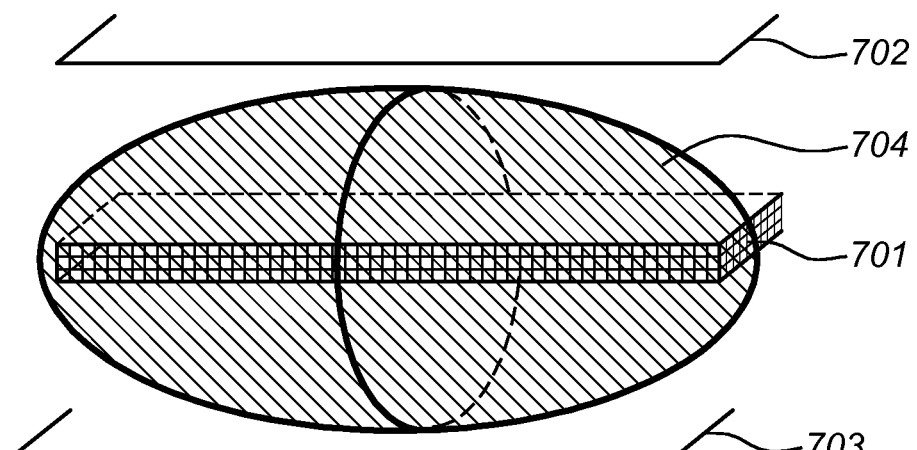

FIGS. 7A-7B illustrate embodiments according to the present invention whereby diffuser material is positioned at least partially around the substrate or substrates to be coated and/or a tray for holding the substrate or substrates in a colloidal way.

Figure 8:
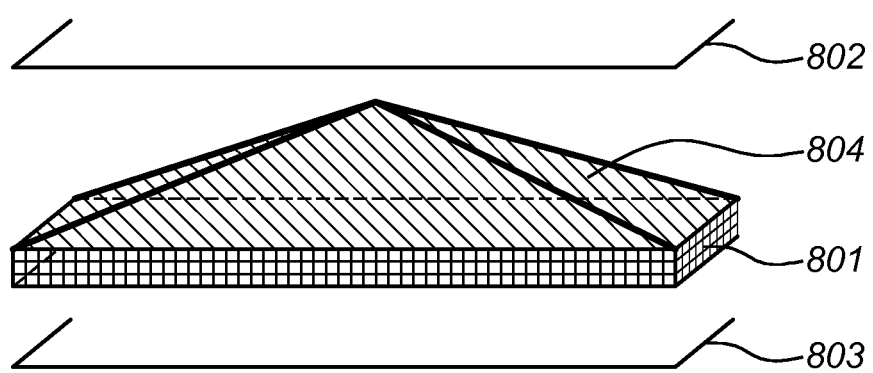
Figure 9A:
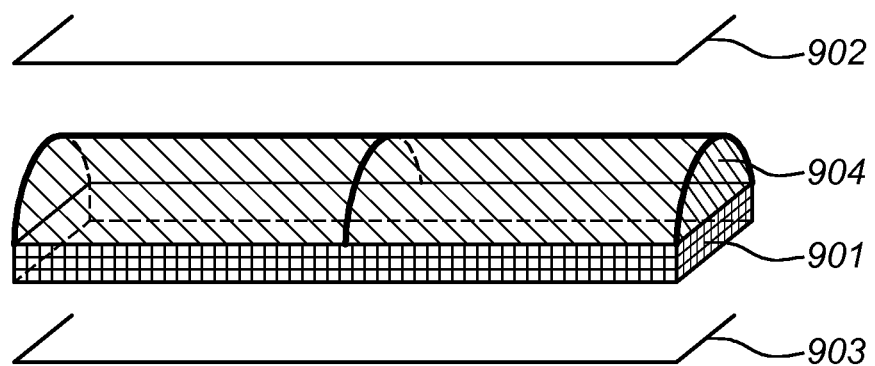
Figure 9B:
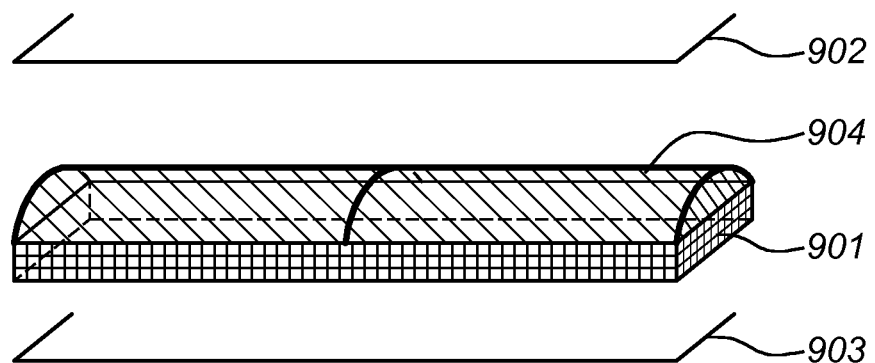

FIGS. 8-9B illustrate embodiments of 3D-plasma diffusers according to the present invention, having a shape other than colloidal and cylindrical which may also be used when considered to be better.

Figure 10:
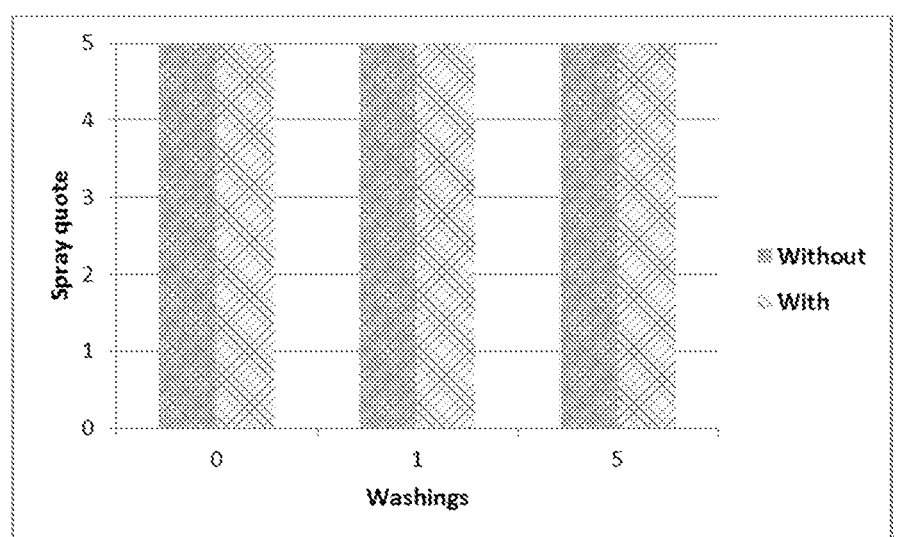

FIG. 10 compares spray results coming from samples treated with plasma diffuser and those coated without plasma.

DETAILED DISCUSSION OF THE INVENTION AND PREFERRED EMBODIMENTS

The concept of the plasma diffuser is explained further in this description and in the claims, and by means of examples and Figures it will become clear that the plasma diffuser is easy to use, is versatile and adaptable.

As used herein, the following terms have the following meanings:

"A", "an", and "the" as used herein refers to both singular and plural referents unless the context clearly dictates otherwise. By ways of example, "an electrode" refers to one or more than one electrode, "a substrate" refers to one or more than one substrate, "a tray" refers to one or more than one tray.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise", "comprising", and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints.

Its design can be chosen in a way that the plasma diffuser may have a fixed position in the chamber for use with every batch, or may be in a way that the diffuser is only mounted in the chamber together with the products that benefit from the use of the plasma diffuser, e.g. through the use of a loading rack. This reduces the handling coming from the plasma diffuser, so that in mass production the throughput numbers are guaranteed and not limited by too much additional handling and loose of time.

Further, the plasma diffuser may be used in a wide variety of processing conditions and plasma chambers. For example, the plasma diffuser may be used in both pulsed plasma processes and continuous wave processes, since both power settings tend to show discolouration on dark substrates, such as black, grey, dark blue, dark green, dark purple substrates, but also on substrates having a high gloss surface or a low surface roughness (e.g. soft feel surfaces or polished surfaces).

Thanks to the concept of the plasma diffuser, which gives surprisingly good results, is easy in use and is adaptable to the needs of the customers or to the products that need plasma treatment, more applications and markets may benefit from the added value coming from plasma processes.

Black and dark substrates appear black or dark to the human eye because the wavelengths of the incident light—whether it is daylight, direct sunlight, TL light, and so on—are all absorbed to a large extent. Only a minor fraction of the incident light is reflected from the surface. All substrates have a certain topology or smoothness. The discolouration arises on smooth surfaces after coating because of small (nano-)variations in coating thickness over the sample. This leads to nano-roughness of the surface, giving a more diffuse reflection of the fraction of the light that is reflected for dark to black substrates. Since the light is reflected in a non-regular diffuse way, the different wavelengths of which the light is composed may diffract leading to a rainbow-like discolouration.

The effect is more pronounced for longer process times, during which coatings are deposited that are in general thicker than with reduced plasma times. When the thickness of the coating is larger, the nano-roughness may also be larger, leading to a more pronounced discolouration effect. Therefore, in an embodiment, the coating applied to the substrate comprises a thickness which is larger than 20 nm, preferably larger than 50 nm, even more preferably larger than 100 nm.

The discolouration is also particularly pronounced for coatings comprising a thickness comparable to the wavelength of visible light, e.g. thicknesses between a tenth of the smallest visible wavelength and 10 times the largest visible wavelength. Therefore, in an embodiment, the coating applied to the substrate comprises a thickness which is larger than 10 nm, preferably larger than 20 nm, even more preferably larger than 100 nm, and/or a thickness which is smaller than 5000 nm, preferably smaller than 2500 nm, more preferably smaller than 1000 nm. Applicant developed a so-called "plasma diffuser", which reduces the effects from uneven plasma distribution inside the plasma chamber, and which leads to a more homogeneous plasma distribution and plasma density all over the chamber. Thanks to this, the nano-roughness of the coating on the substrates is reduced, leading to reduced diffuse reflection of the reflected fraction of the incident light. Consequently, the rainbow-like colours and/or other colour changes may be reduced up to 100%.

The plasma diffuser and/or the method of the present invention can be used for all kind of substrates and materials, in many different shapes and dimensions.

The effect of discolouration is more pronounced in large-scale set-ups. Whereas in small set-ups, the discolouration effect could be compensated to a reasonable degree by adapting the process parameters and optimal design of the reaction chamber, this is not always possible in larger set-ups because of the larger volume and several components inside the chamber, such as electrodes, trays, gas inlets, pump outlets, etc. Therefore, in an embodiment, the method of the present invention is applied in a reaction chamber comprising a volume which is larger than 0.1l, preferably larger than 0.2l, more preferably larger than 0.3l, even more preferably larger than 0.4l, yet more preferably larger than 0.5l, still more preferably larger than 0.6l, yet even more preferably larger than 0.8l, yet still more preferably larger than 1l, even still more preferably larger than 2l, still yet more preferably larger than 5l, yet still more preferably larger than 10l, still more preferably larger than 20 l.

The present invention allows to treat large substrates, or many substrates at the same time, e.g. many items which can be placed in a tray in the apparatus. Therefore, in a preferred embodiment, the substrate, the substrates, the tray holding one or more substrates and/or the combined size of all substrates comprise at least one dimension which is larger than 10 cm, preferably larger than 20 cm, more preferably larger than 30 cm.

Another effect which has been observed is that discolouration worsens if the distance between substrate and one or more electrodes decreases. This can be attributed to small inhomogeneities in plasma density which can arise from the electrode geometry or small inhomogeneities in said geometry or from other effects. If the substrate is placed close by one or more of the electrodes, those inhomogeneities will give rise to inhomogeneities in the coating thickness, and thus in increased discolouration. The use of a plasma diffuser and/or a method according to the present invention allows to place the substrate close to the electrodes while at least partially avoiding discolouration. This allows the use of smaller reaction chambers for a specified amount or size of substrates to be coated, or allows coating of a larger amount or size of substrates in a reaction chamber with given dimensions. Therefore, in an embodiment, the reaction chamber comprises a volume which is smaller than 10 000 l, preferably smaller than 5000 l, more preferably smaller than 3000 l, yet more preferably smaller than 2500 l.

For example, textiles in the form of sheets or garments that have parts of the surface in dark to black colours, such as outdoor, sport and leisure textiles, or technical garments used for protective wear such as PPE (personnel protective equipment), will show no colour difference between an uncoated and a coated piece. Garments are clothing items such as, but not limited to, jackets, trousers, bonnets, gloves, and coats. Other textile products can be 3D pieces, such as shoes, laces, bags, backpacks, tents, scarfs, etc.

The textiles can be of natural, man-made, or synthetic fibres, or any blend of the foregoing materials. Examples of materials include but are not limited to:

Synthetic: polypropylene (PP), polyethylene (PE), polyvinylchloride (PVC), polystyrene (PS), polyphenylene sulfide (PPS), polyacrylonitrile (PAN), polyurethane (PUR), polyurea, polytetrafluoroethylene (PTFE) and expanded polytetrafluoroethylene (ePTFE), polyester (PES)—such as polyethylene terephthalate (PET), recycled PET and polybutylene terephthalate (PBT), polyamide (PA)—such as PA6, PA66, and PA12, polyaramide, elastane (polyurethane-polyurea copolymer).

Natural and man-made: cotton, cellulose, cellulose acetate, silk, wool, etc.

Blends: cotton/PES 50:50, PES/carbon 99:1, recycled PES/elastane 92:8, PA6/elastane 80/20, etc.

The textiles may be nonwovens, woven or knitted structures, membranes (both microfiber and nanofiber membranes), films, foils, or composites made of at least two layers of nonwovens, woven or knitted structures, membranes, films or foils, wherein the layers may be the same textile structure or a different structure. An example of such a composite is a laminate consisting of a sandwich structure of a woven textile, a membrane and a backing layer which may be a non-woven or a woven. Another example of such a composite is a laminate consisting of a nonwoven textile used as backing layer, and a membrane produced directly onto said backing layer.

Other substrates on which the plasma diffuser of the present invention has shown benefits, are 3D-shaped plastic parts, such as the casings for hand held devices, such as phones, smartphones, tablets, laptops, GPS systems, and so on, or the casing for glasses. All types of polymers used to manufacture such plastic parts can be coated using the plasma diffuser of the present invention to highly reduce unwanted colour change, such as (but not limited to): polyolefins such as polypropylene (PP) and polyethylene (PE), polyvinylchloride (PVC), polyamides (PA), polyesters (PES), polystyrene (PS), polytetrafluoroethylene (PTFE), and the like.

The plasma diffuser may also be used to avoid discolouration in the coating of electronics, such as a printed circuit board (PCB), hearing aids, headsets, speakers, etc. These products often consist of multiple materials, such as plastics and conductive metals.

The plasma diffuser may also be used to avoid discolouration on optical components, such as lenses, mirrors, and on glass, for use in various applications such as cameras, hand held electronic devices such as tablets and smartphones, but sports applications as well, such as diving goggles, swimming goggles, compasses, watches, and so on. Other applications that may be envisaged are mirrors used in the automotive market, alongside the road, at home, etc. In particular larger components, which are more sensible to discolouration due to inhomogeneities of the coating, and where the discolouration such as a rainbow-like shine, are more easily visible, may benefit from the use of a plasma diffuser during the plasma treatment.

The principle of the plasma-diffuser is thus the diffusion of the plasma to obtain a more homogeneous, less uneven plasma distribution, giving a more uniform treatment, which leads to less discolouration on the surface or surfaces of the substrates.

Preferably, the plasma diffuser comprises diffuser material and is preferably made of a diffuser material and optionally comprises a frame to support the diffuser material.

In a first embodiment, the plasma diffuser material comprises an open cell polymer structure, such as a textile structure, for example a nonwoven, a woven, a knitted structure, or a membrane, or a flat polymer structure such as a foil or a film. Preferably the polymer structure has a certain porosity and breathability which allows the plasma to pass the plasma diffuser in a controlled way to reach the substrates to be coated.

The textile structure may comprise one polymer, or a combination of two or more polymers. The polymers that may be used can be (but are not limited to): polyolefins such as polypropylene (PP) and polyethylene (PE), polyvinylchloride (PVC), polyamides (PA), polyesters (PES), polystyrene (PS), polytetrafluoroethylene (PTFE), and the like. Preferably a polymer having a low moisture content is used, such as a polyester, such as polyethylene terephthalate (PET).

In general a regular textile structure can be used as plasma diffuser by using routine techniques to decide on the optimal set-up, starting from the base design of plasma diffuser.

In yet another embodiment, the plasma diffuser material comprises an open cell metal structure, such as a metal mesh. The metal used to make the mesh can be dense or more open. The mesh may comprise any metal, such as aluminium, steel, stainless steel, etc.

When the set-up of the electrodes in the plasma chamber is horizontal, the or each substrate to be treated, e.g. coated, is placed in substantial horizontal position. For example, the or each substrate may be placed on or in a tray or perforated container which is placed in horizontal position between and parallel to the electrodes. Depending on the shape and dimensions of the substrates, the substrates may be placed in horizontal position, vertical position or an intermediate position in the trays. This set-up may be for example used for treating hand held electronic devices, or electronic components, assemblies or subassemblies. The horizontal set-up may be used for treating textile products as well, such as shoes, gloves, etc.

When the set-up of the electrodes in the plasma chamber is vertical, the or each substrate to be treated, e.g. coated, is placed in substantial vertical position. For example, the or each substrate may be hung in the substrate-area (or a "slot") foreseen between the electrodes. They may be hung by using clamps or hangers or other constructions that allow the best exposure of the surfaces to the plasma inside the plasma chamber. Depending on the dimensions of the substrates and the slot or slots, one or more substrates may be hung in one "slot". The vertical set-up may be for example used for treating textile products such as clothing (sweater, jacket, t-shirt, shorts, pairs of pants, scarfs), as well as sheets of textile and other textile items, such as backpacks, ropes, etc.

Whether a horizontal or vertical set-up is used depends on the substrates to be treated.

The applicant further discovered that the porosity or openness of the plasma diffuser material may have an influence on how much the reduction in discolouration is. The less open (the more dense) the structure, the more the discolouration is reduced, as will become clear from the examples. A less open mesh can be obtained by using a more dense or thicker material, or by placing multiple layers on top of each other.

By using multiple layers on top of each other, one may use a single layer for the areas that are less prone to discolouration, while for the more critical areas a double or even triple layer may be used. This gives the possibility to vary the set-up of the plasma diffuser in function of the parts to be treated and their position inside the plasma chamber.

In some embodiments it is preferred not to shield the total surface. For example, the diffuser material may be dimensioned to cover only part of the exposed substrate or tray surface. This is what applicant refers to as "a selective plasma diffuser". Whether the total surface or part of the surface is used for diffusion depends on the substrate(s) to be treated, on the configuration of the plasma chamber, and on the process parameters and molecules used.

For example, in a horizontal set-up for coating electronic components by means of plasma polymerisation, it may be preferred to shield only the corners of the trays or perforated containers, instead of shielding large surfaces.

In some embodiments, where there is a high tendency for discolouration, it may be considered to use a thicker diffuser material, or to use two sheets of diffuser material on top of each other.

When further in the description of the present invention "a sheet" or "a side" is used, it is meant the diffuser material, regardless whether it is a single layer or multiple layers on top of each other, and regardless of it is a full size sheet, or a sheet with limited dimensions for selective diffusion.

More, a selective plasma diffuser may be created not only by removing diffuser material at certain areas, but by adding diffuser material as well. For example, it may be preferred to use a double layer of diffusion material in certain areas, e.g. at the corners, to diffuse the plasma even more.

Preferably, the plasma diffuser comprises one or more plasma diffuser materials positioned between the electrodes, for homogenizing a plasma density nearby said substrate to reduce discolouration of said substrate after processing, the plasma diffuser materials are preferably in the form of a sheet, which may be flat, curved or folded. The plasma diffuser may for instance also comprise different materials, e.g. materials of different density or mesh size, placed at different heights or positions, e.g. for selective plasma diffusion.

In its simplest form, the plasma diffuser consists of a sheet of diffuser material, which is placed between the substrate or substrates and one or each electrode. This type of plasma diffuser can be seen as a 2D-plasma diffuser.

Preferably, the dimensions of the 2D-plasma diffuser are chosen such that it is equal to or larger than the complete surface of the substrate(s) or tray so as to diffuse the plasma over the total substrate or tray surface.

Figure 1A:
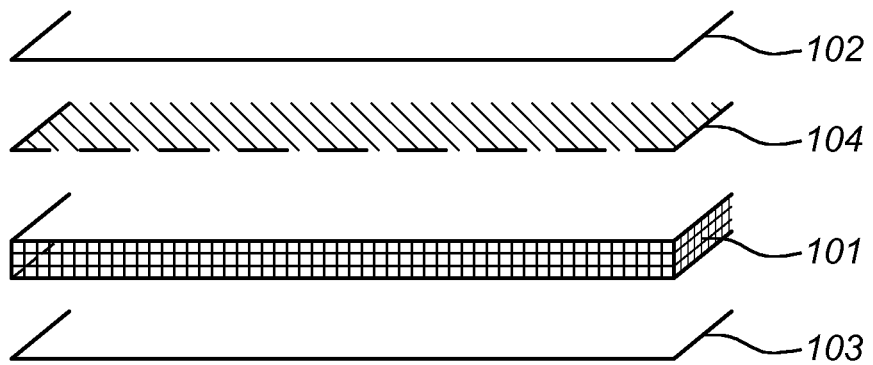
FIGS. 1A-1H illustrate embodiments according to the present invention whereby diffuser material is placed between a radiofrequency (RF) electrode and the substrate or substrates to be coated and/or a tray for holding the substrate or substrates.

Preferably, when using a 2D-plasma diffuser, the diffuser material is placed between the or each radiofrequency electrode and the or each substrate. FIG. 1A shows a 2D-plasma diffuser in horizontal set-up, wherein only a single tray 101, a single radiofrequency (RF) electrode 102 and a single grounded electrode (M) 103 are shown. The substrates to be treated are placed in the tray 101. The diffuser material 104 is placed between the tray 101 and the RF electrode 102.

Figure 1B:
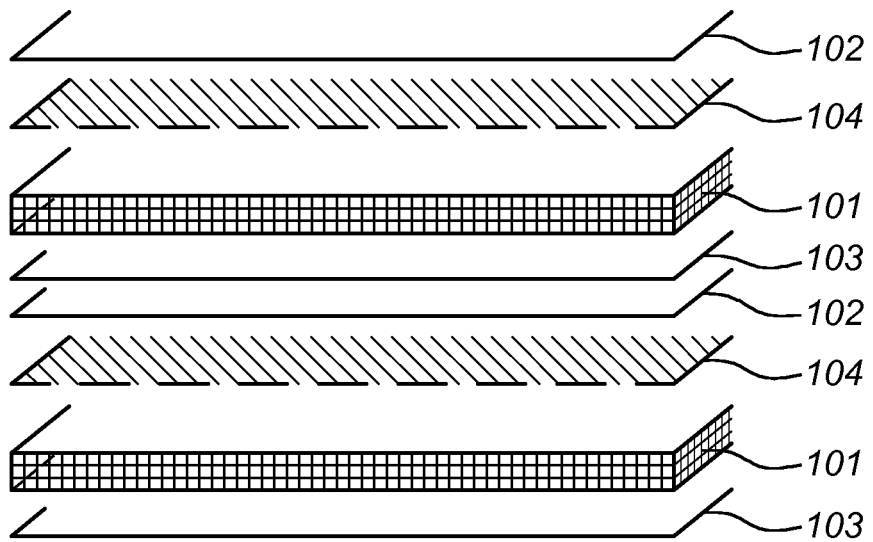

FIG. 1B shows a horizontal set-up consisting of twice the configuration of FIG. 1A, for example for use in a larger plasma chamber so as to allow more substrates to be treated in one single processing run. The substrates to be treated, for example coated, are placed in the trays 101, which are placed between for example an RF electrode 102 and a M electrode 103. A sheet of diffuser material 104 is placed between each tray 101 and RF electrode 102.

Figure 1C:
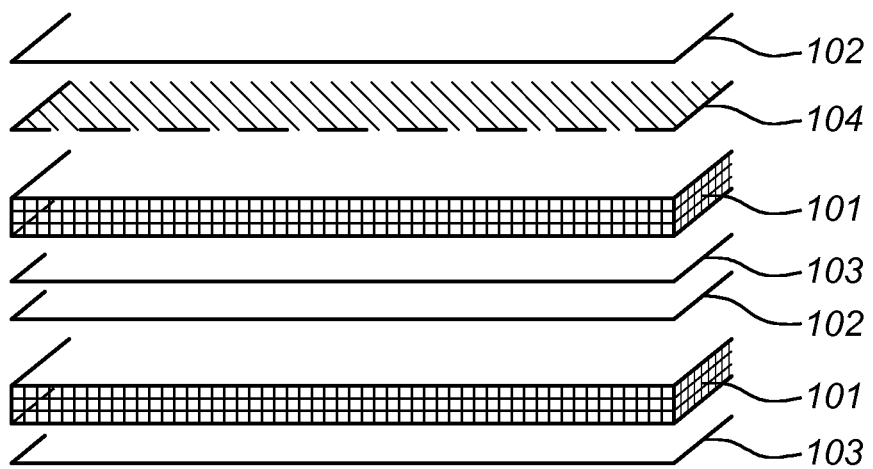

In some embodiments, it may be preferred to use the plasma diffuser not between each tray 101 and each RF electrode 104, as is represented in FIG. 1C.

Figure 1D:
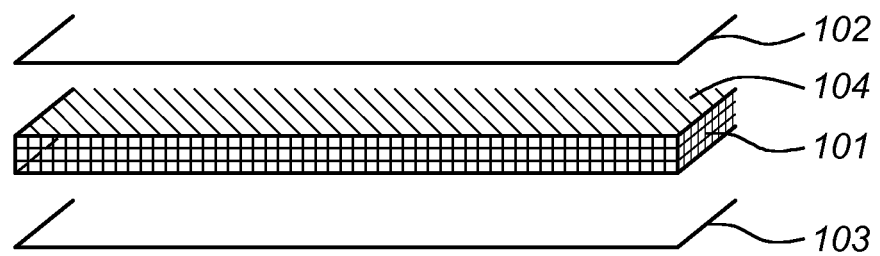
Figure 1E:
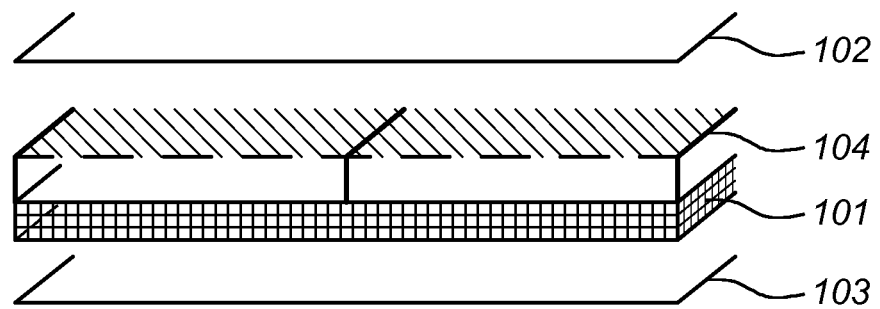

Depending on the size of the substrates to be treated, the sheet of diffuser material 104 may be placed on top of tray 101 (FIG. 1D)—for example when the height of the substrates as placed in the tray doesn't exceed the height of the tray. In another embodiment the sheet of diffuser material 104 may be placed at a certain distance from tray 101 (FIG. 1E). The distance between the substrates or the tray and the diffuser material, and between the diffuser material and the RF electrode, may be varied and is to be determined in function of the performance of the coating after processing, and in function of the discolouration reduction.

Figure 1F:
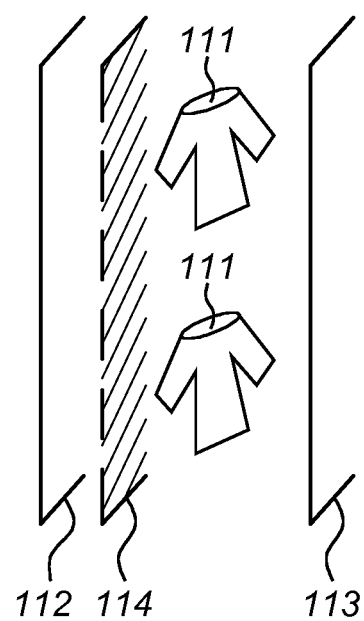

FIG. 1F shows a vertical embodiment wherein a substrate to be treated 111 is placed in a slot determined by RF electrode 112 and M electrode 113. A sheet of diffuser material 114 is placed between the substrate 111 and the RF electrode 112.

Figure 1G:
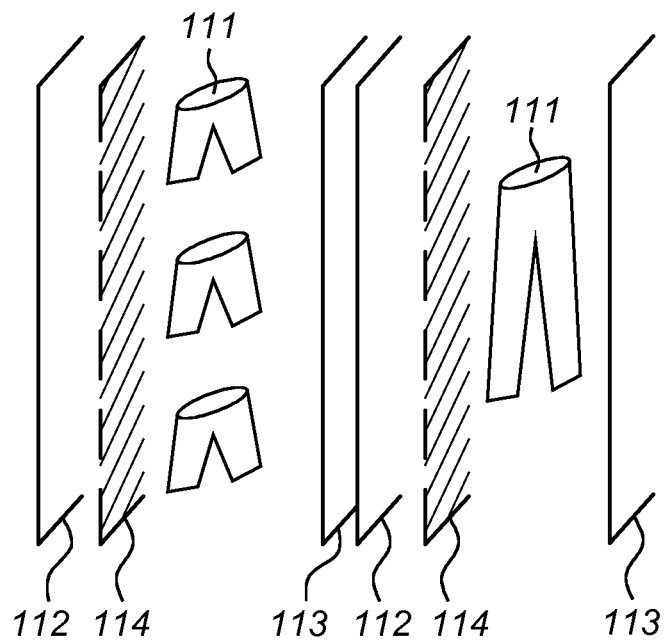
Figure 1H:
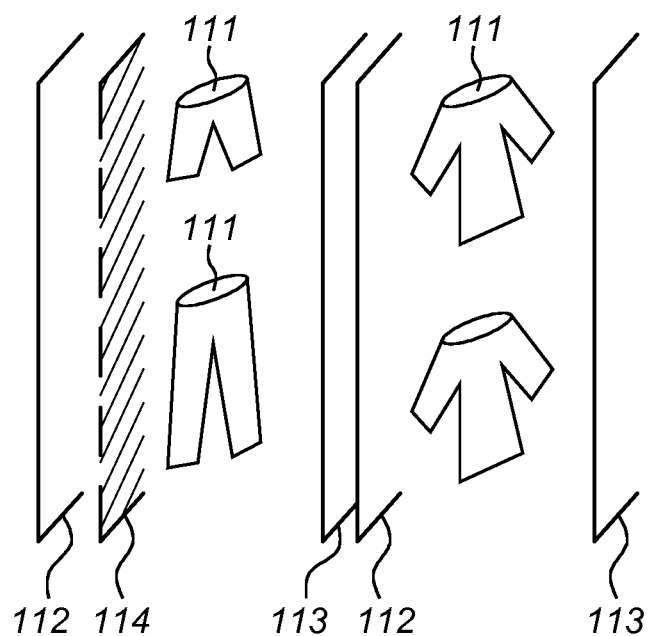

FIG. 1G shows a vertical embodiment wherein the configuration of FIG. 1H is repeated. Three substrates to be treated 111 are placed within one slot determined by RF electrode 112 and M electrode 113. A sheet of diffuser material is placed between the substrates 111 and the RF electrodes 112.

In some embodiments, it may be preferred to use the plasma diffuser not in all slots, as is represented by FIG. 1H.

In another embodiment, the sheet of diffuser material is positioned between the or each grounded electrode (M) and the or each substrate.

Figure 2A:
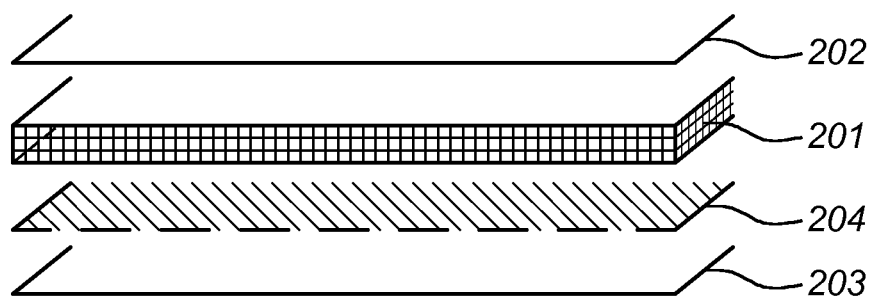
FIGS. 2A-2H illustrate embodiments according to the present invention whereby diffuser material is placed between a grounded (M) electrode and the substrate or substrates to be coated and/or a tray for holding the substrate or substrates.

FIG. 2A shows a 2D-plasma diffuser in horizontal set-up, wherein only a single tray 201, a single radiofrequency (RF) electrode 202 and a single grounded electrode (M) 203 are shown. The substrates to be treated are placed in the tray 201. The diffuser material 204 is placed between the tray 201 and the M electrode 203.

Figure 2B:
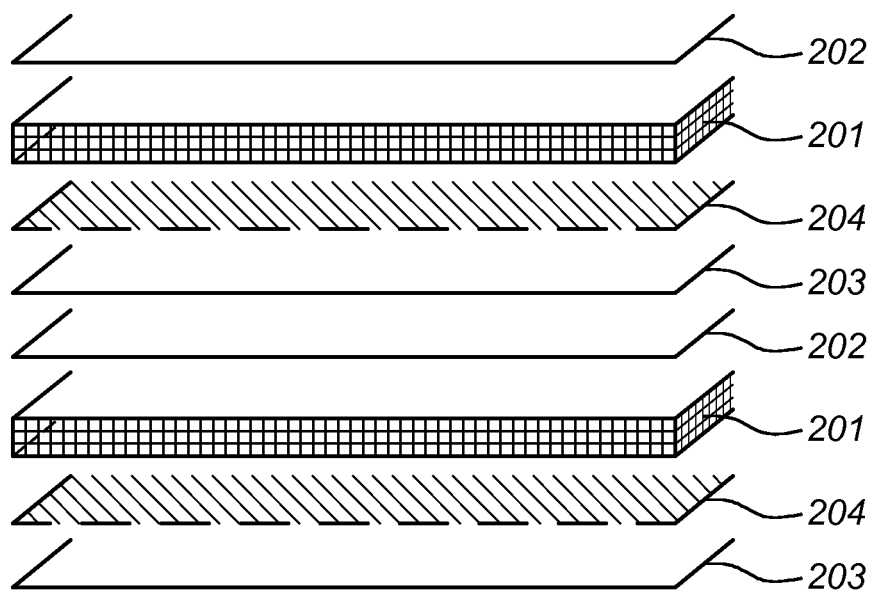

FIG. 2B shows a horizontal set-up consisting of twice the configuration of FIG. 2A, for example for use in a larger plasma chamber so as to allow more substrates to be treated in one single processing run. The substrates to be treated, for example coated, are placed in the trays 201, which are placed between for example an RF electrode 202 and a M electrode 203. A sheet of diffuser material 204 is placed between each tray 201 and M electrode 203.

Figure 2C:
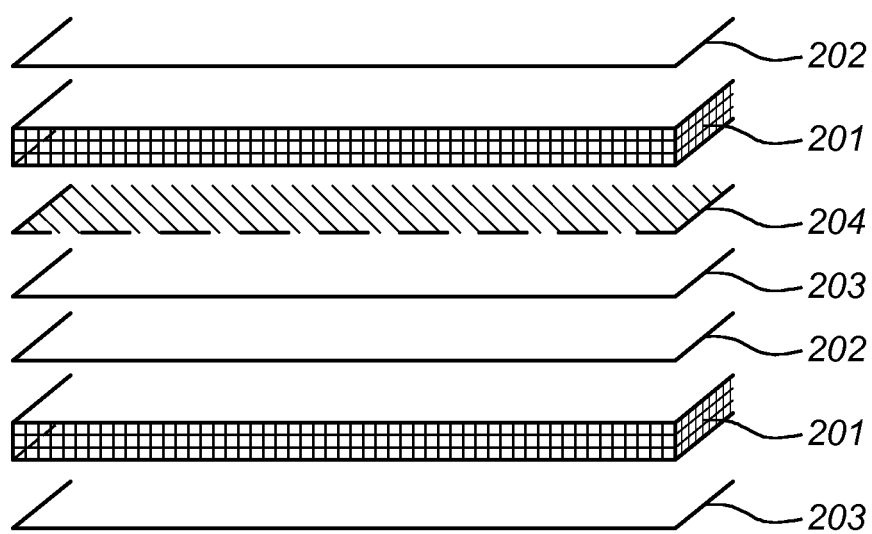

In some embodiments, it may be preferred to use the plasma diffuser not between each tray 201 and each M electrode 203, as is represented in FIG. 2C.

Figure 2D:
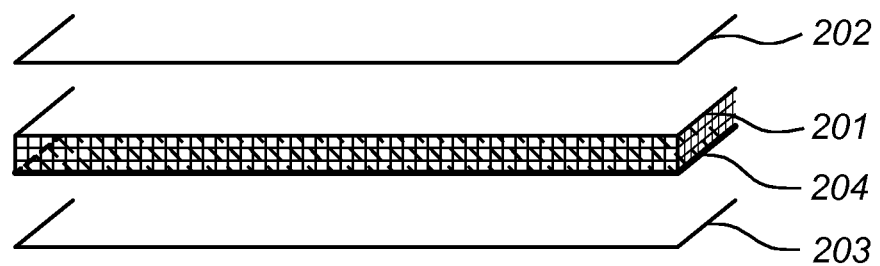
Figure 2E:
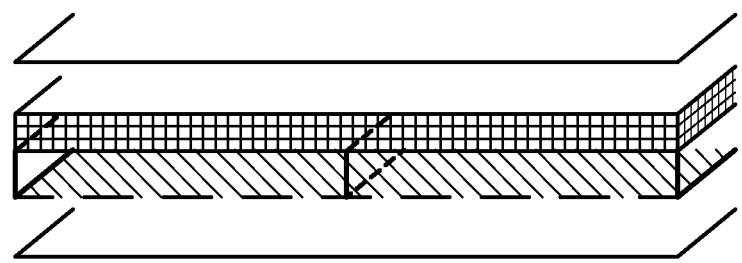

Depending on the size of the substrates to be treated, the sheet of diffuser material 204 may be placed at the bottom of tray 201 (FIG. 2D). In another embodiment the sheet of diffuser material 204 may be placed at a certain distance from tray 201 (FIG. 2E). The distance between the substrates or the tray and the diffuser material, and between the diffuser material and the M electrode, may be varied and is to be determined in function of the performance of the coating after processing, and in function of the discolouration reduction.

Figure 2F:
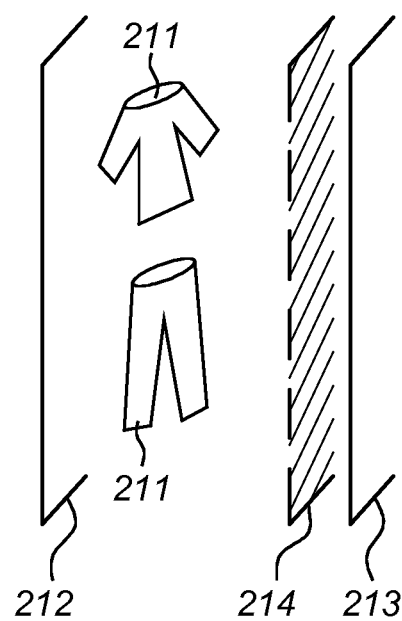

FIG. 2F shows a vertical embodiment wherein a substrate to be treated 211 is placed in a slot determined by RF electrode 212 and M electrode 213. A sheet of diffuser material 214 is placed between the substrate 211 and the M electrode 213.

Figure 2G:
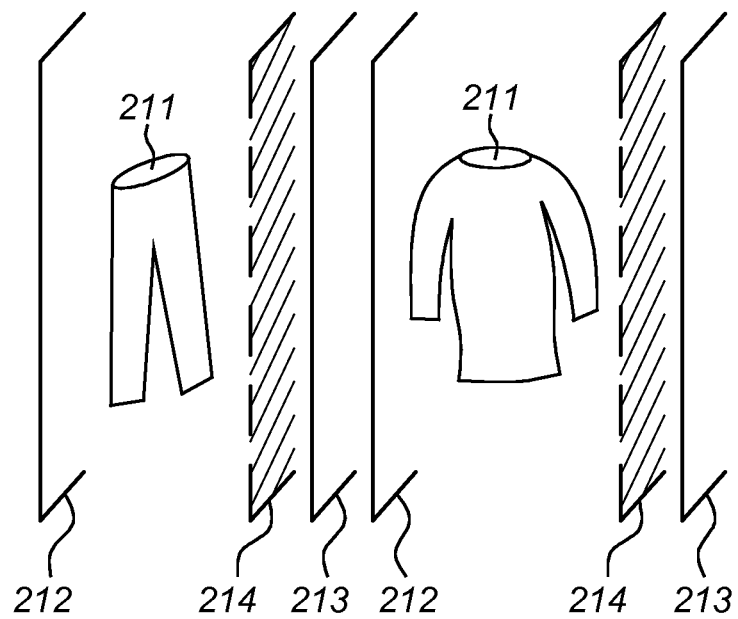

FIG. 2G shows a vertical embodiment wherein the configuration of FIG. 2F is repeated. Three substrates to be treated 211 are placed within one slot determined by RF electrode 212 and M electrode 213. A sheet of diffuser material is placed between the substrates 211 and the M electrodes 213.

Figure 2H:
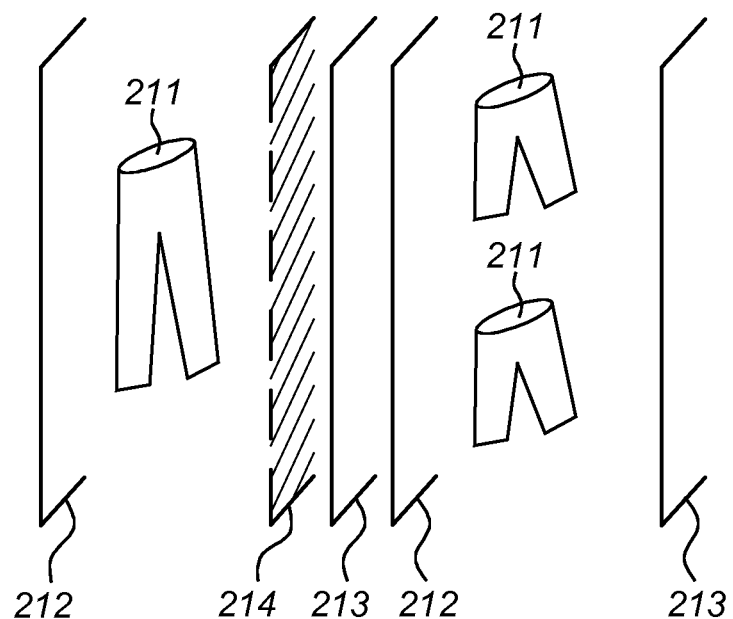

In some embodiments, it may be preferred to use the plasma diffuser not in all slots, as is represented by FIG. 2H.

In another embodiment, a sheet of diffuser material is placed between the or each radiofrequency electrode and the or each substrate, and between the or each grounded electrode and the or each substrate. This set-up is still considered to be a 2D-plasma diffuser by the application, since both sheets of diffuser material are parallel to each other.

Figure 3A:
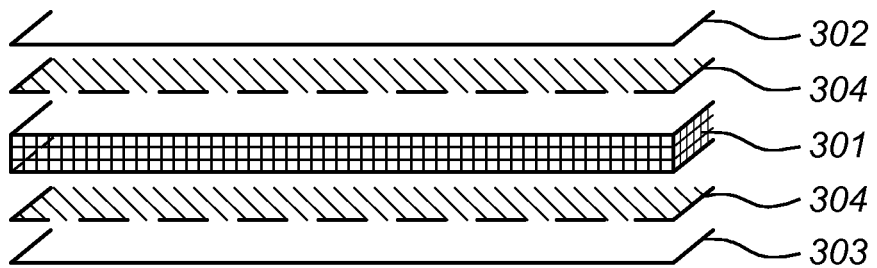

FIG. 3A shows a 2D-plasma diffuser in horizontal set-up, wherein only a single tray 301, a single radiofrequency (RF) electrode 302 and a single grounded electrode (M) 303 are shown. The substrates to be treated are placed in the tray 301. The diffuser material 304 is placed between the tray 301 and the RF electrode 302, and between the tray 301 and the M electrode 303.

Figure 3B:
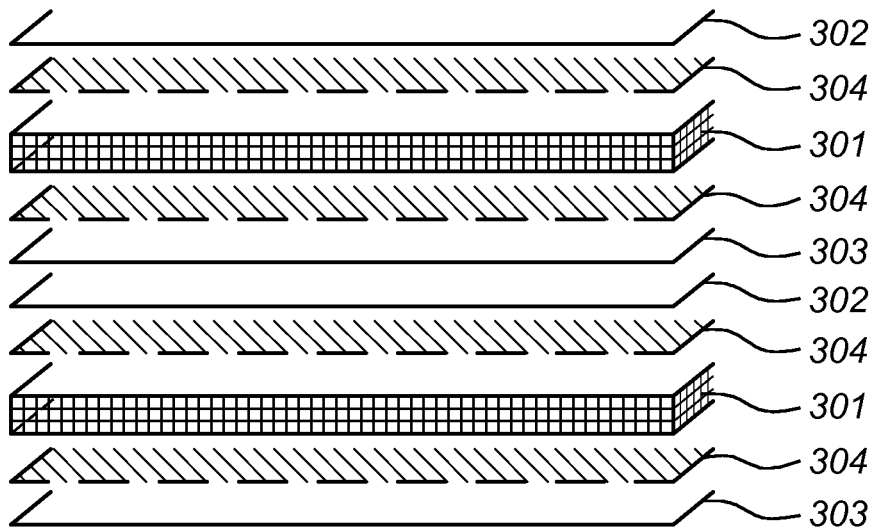
Figure 3C:
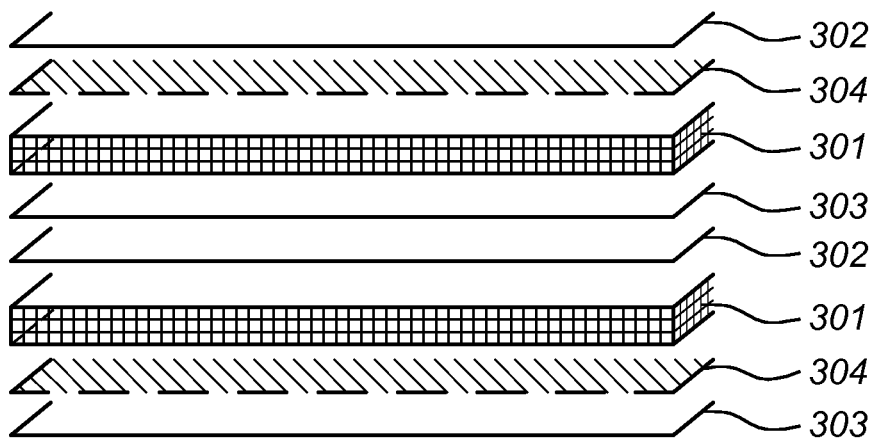

FIG. 3B shows a horizontal set-up consisting of twice the configuration of FIG. 3A, for example for use in a larger plasma chamber so as to allow more substrates to be treated in one single processing run. The substrates to be treated, for example coated, are placed in the trays 301, which are placed between for example an RF electrode 302 and a M electrode 303. A sheet of diffuser material 304 is placed between each tray 301 and RF electrode 302, and between each tray 301 and M electrode 303.

In some embodiments, it may be preferred to use the plasma diffuser not between each tray 301 and each RF electrode 302 and between each tray 301 and each M electrode 303, as is given by means of exemplary configuration in FIG. 2C.

Figure 3D:
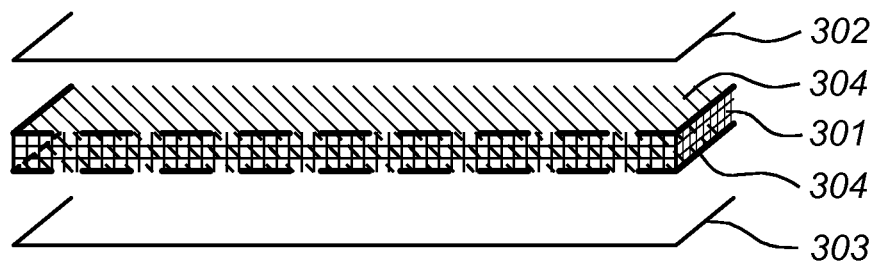
Figure 3E:
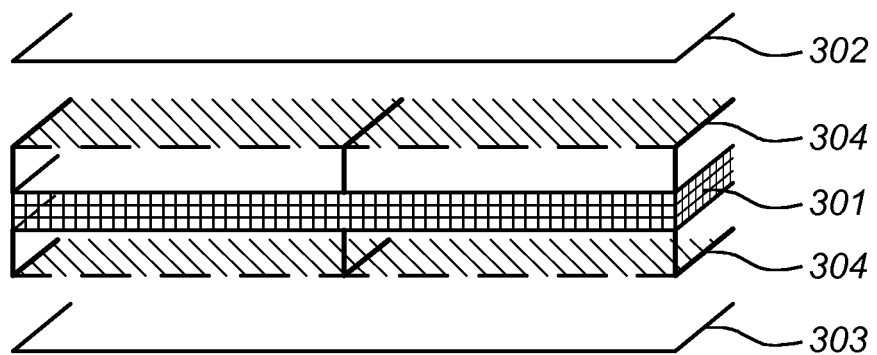
Figure 3F:
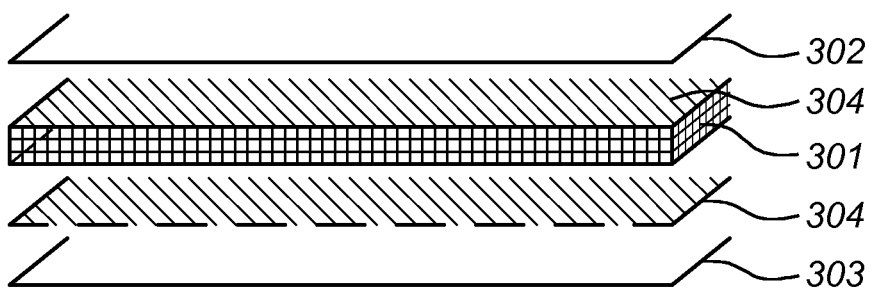
Figure 3G:
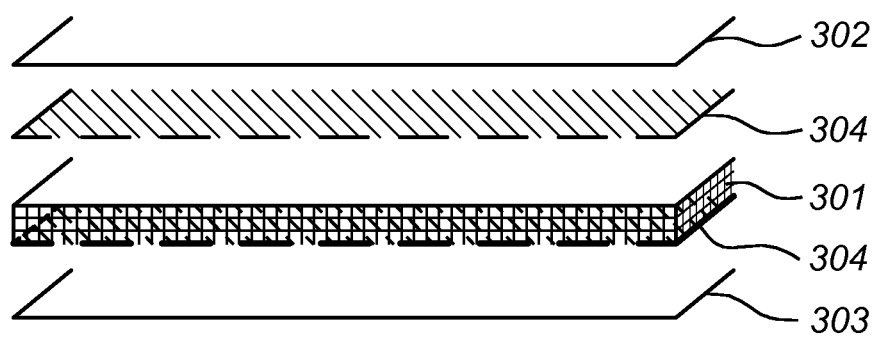

Depending on the size of the substrates to be treated, the sheet of diffuser material 304 may be placed on top of tray 301 and at the bottom of tray 301 (FIG. 3D). In another embodiment the sheet of diffuser material 304 may be placed at a certain distance from tray 301 in both directions (FIG. 3E). In yet another embodiment, the sheet of diffuser material 304 may be place on top of tray 301 and at a certain distance from tray 301 towards the M electrode 303 (FIG. 3F). In yet another embodiment, the sheet of diffuser material 304 may be place at a certain distance from tray 301 towards the RF electrode 302, and may be placed at the bottom of tray 301 (FIG. 3G).

The distance between the substrates or the tray and the diffuser material, and between the diffuser material and the M electrode, may be varied and is to be determined in function of the performance of the coating after processing, and in function of the discolouration reduction.

Figure 3H:
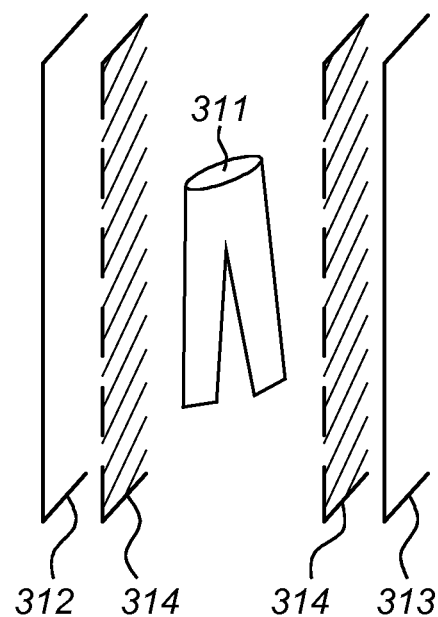

FIG. 3H shows a vertical embodiment wherein a substrate to be treated 311 is placed in a slot determined by RF electrode 312 and M electrode 313. A sheet of diffuser material 314 is placed between the substrate 311 and the RF electrode 312, and between the substrate 311 and the M electrode 313.

Figure 3I:
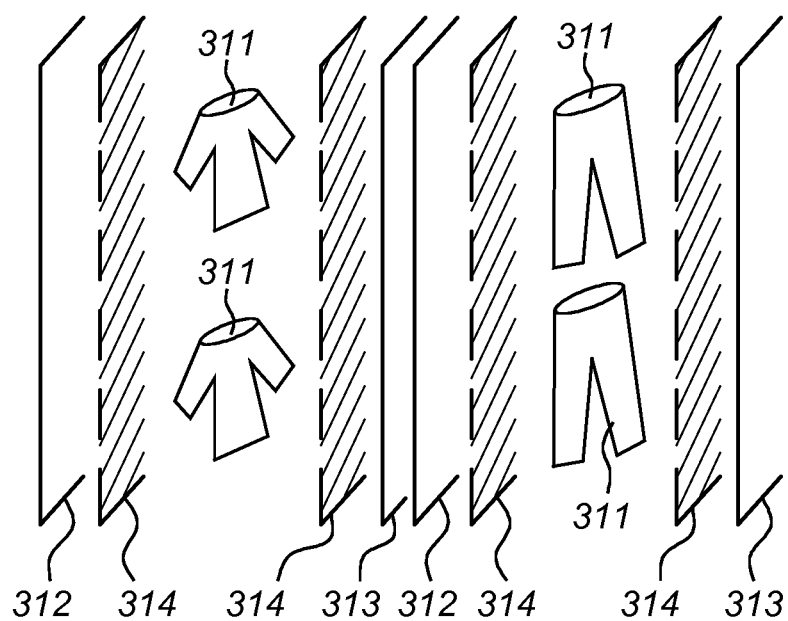

FIG. 3I shows a vertical embodiment wherein the configuration of FIG. 3H is repeated. Three substrates to be treated 311 are placed within one slot determined by RF electrode 312 and M electrode 313. A sheet of diffuser material 314 is placed between the substrate 311 and the RF electrode 312, and between the substrate 311 and the M electrode 313.

Figure 3J:
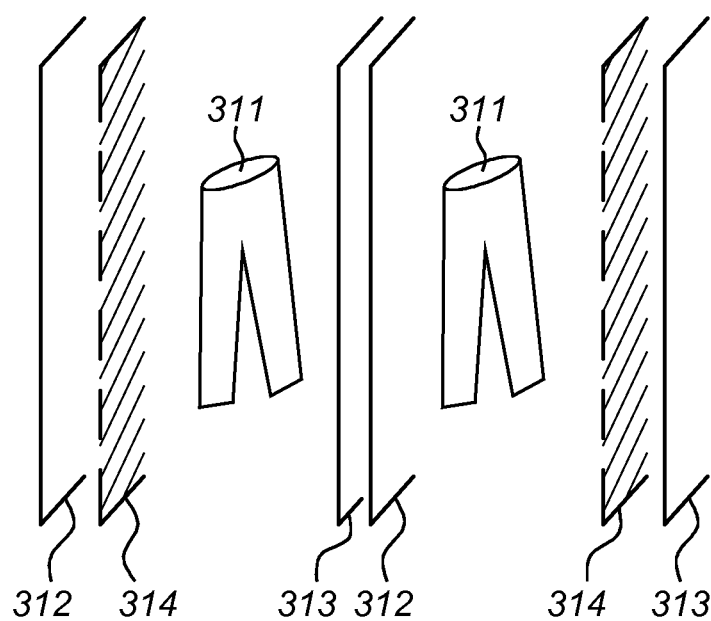

In some embodiments, it may be preferred to use the plasma diffuser not in all slots, as is represented by FIG. 3J.

Preferably, the distance between the substrates and the 2D-plasma diffuser is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the 2D-plasma diffuser and the electrode or electrodes of the plasma chamber is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

2D-plasma diffusers are easy to use, but may provide in some cases limited diffusion. In those situations where more diffusion is required, a 3D-plasma diffuser may be used. 3D-plasma diffusers may vary in shape and number of sides, but in general at least one side or one surface of the plasma diffuser is not fully parallel to the electrodes.

3D-plasma diffusers may be constructed around a frame, but in some embodiments no frame is used and the plasma diffuser consists of diffuser material only. Whether a frame is recommended or not depends on the shape, the set-up and the dimensions of the plasma diffuser.

Preferably the frame is a rigid or semi-rigid structure used as the body around which the plasma diffuser material is placed. The frame may have a certain flexibility but needs to be strong enough to hold the plasma diffuser material without the risk of the diffuser to collapse and to make contact with the substrates to be treated.

The frame may be constructed from all materials suited to be used inside a low pressure plasma equipment, such as—but not limited to—aluminium, steel such as stainless steel, polymers such as HDPE, PS, PP and PTFE (known as Teflon), and any mixtures of the foregoing.

The frame may consist of bars that are put together, bars having a circular cross-section, a rectangular or a square cross-section. Preferably, the cross-section has a surface of 1 cm$^2$ or less.

In some horizontal embodiments, the tray itself may be used as frame.

In the simplest way, a 3D-plasma diffuser may be seen as a 2D-plasma diffuser whereat additional diffuser material is added.

Figure 4A:
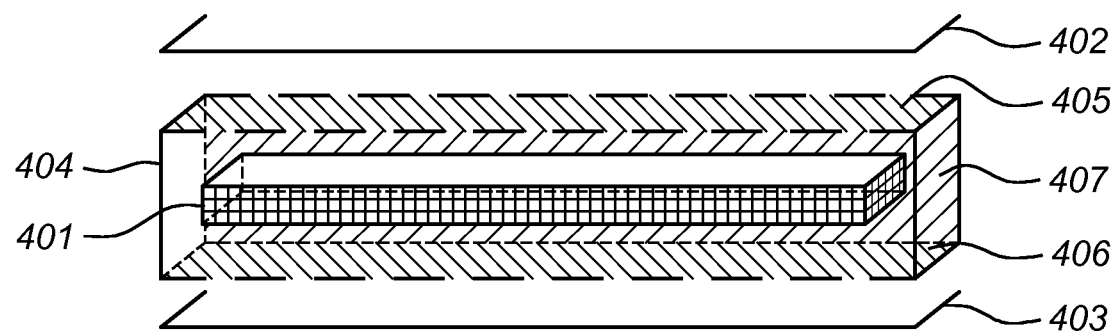

FIG. 4A shows a plasma diffuser for a horizontal electrode set-up. This plasma diffuser may be generated from the plasma diffuser showed in FIG. 3A. The substrate or substrates to be treated are placed on tray 401, which is positioned between RF electrode 402 and M electrode 403. A plasma diffuser 404 is constructed around tray 401, and comprises a top side 405 placed between tray 401 and the RF electrode 402, a bottom side 406 placed between tray 401 and the M electrode 403 (which is thus equal to the diffuser of FIG. 3A), and comprises a back side 407 as well. The back side 407 is perpendicular to the plane of the electrodes 402 and 403, and connects the top side 405 and the bottom side 406. The front side remains open, which allows the easy positioning of the substrate or substrates on tray 401.

Sides 405 and 406 of the plasma diffuser 404 are placed at a certain distance between the tray (or the substrates) and the electrodes, and side 407 is placed at a certain distance between the tray 401 and the back wall of the plasma chamber. In this embodiment, a frame is used to keep the diffuser material in place.

In another embodiment, the plasma diffuser has no back side but a front side.

Figure 4B:
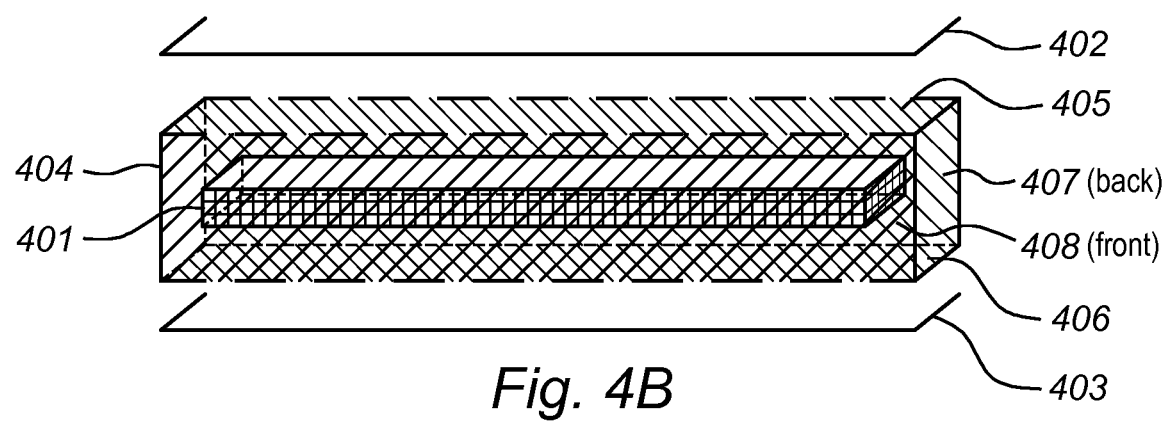

In yet another embodiment, represented by FIG. 4B, the plasma diffuser 404 is constructed again around a tray 401, and both the plasma diffuser 404 and the tray 401 are placed between a RF electrode 402 and a M electrode 403. The plasma diffuser 404 has a top side 405, a bottom side 406, a back side 407 and a front side 408. Only the left and the right side are not filled with any diffuser material. This embodiment may be used to diffuse the plasma away from the electrodes, while at the same time easy entrance of precursor molecules in the area between the plasma diffuser and the substrates (or trays) is made possible. Sides 405 and 406 of the plasma diffuser 404 are placed at a certain distance between the tray (or the substrates) and the electrodes, side 407 may be placed at a certain distance between tray 401 and the back wall of the plasma chamber, and side 408 may be placed at a certain distance between tray 401 and the front wall of the plasma chamber. In this embodiment, a frame is used to keep the diffuser material in place.

Figure 4C:
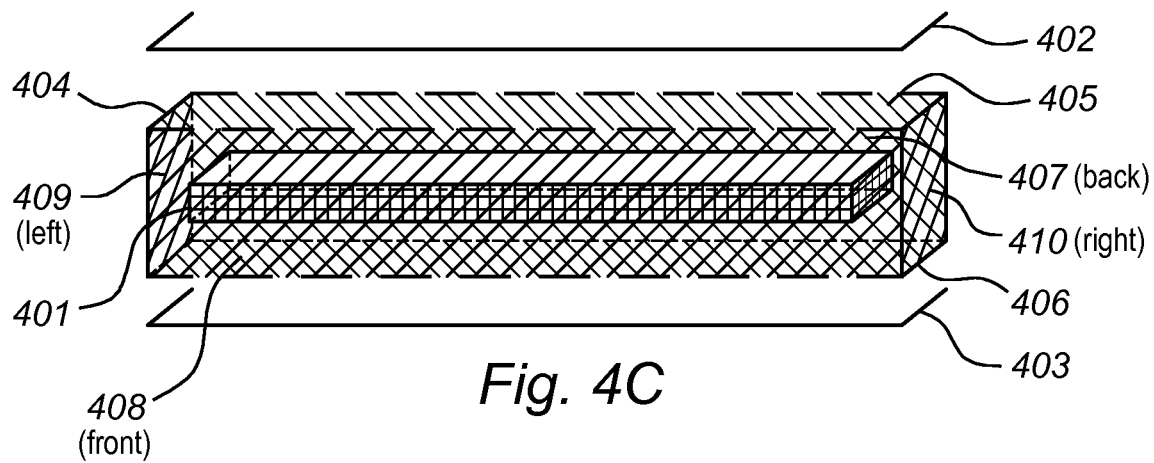

FIG. 4C shows the plasma diffuser of FIG. 4B, where now as well the left side 409 and the right side 410 are filled with plasma diffuser material. The plasma diffuser is now a colloidal shape having 6 sides (all sides) filled with plasma diffuser material. Sides 405 and 406 of the plasma diffuser 404 are placed at a certain distance between the tray (or the substrates) and the electrodes, side 407 is placed at a certain distance between tray 401 and the back wall of the plasma chamber, side 408 is placed at a certain distance between tray 401 and the front wall of the plasma chamber, side 409 is placed at a certain distance between tray 401 and the left wall of the chamber, and side 410 is placed at a certain distance between tray 401 and the right wall of the plasma chamber. In this embodiment, a frame is used to keep the diffuser material in place.

Preferably, for the embodiments represented schematically by FIGS. 4A to 4C, the distance between the substrates placed inside the plasma diffuser and the diffuser material of the plasma diffuser is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the sides of the plasma diffuser parallel to the electrodes of the plasma chamber and the electrodes is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

Preferably, the distance between the sides of the plasma diffuser perpendicular to the plane of the electrodes and the walls of the plasma chamber parallel to said sides of the plasma diffuser is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

Figure 4D:
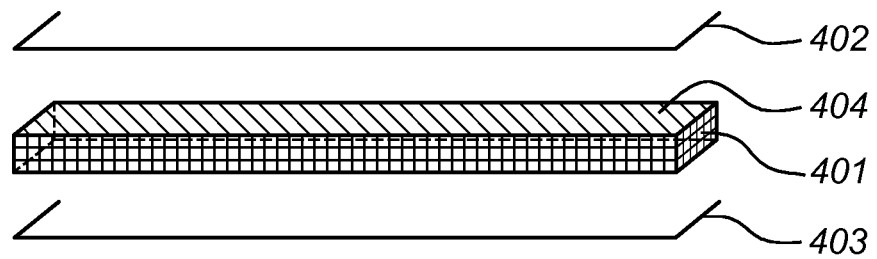

FIG. 4D shows the plasma diffuser of FIG. 4C, wherein the tray 401 itself is used as frame. This is possible for substrates that have dimensions that don't exceed the dimensions (especially the height) of the tray 401. Consequently, the distance between the substrates in the tray and the plasma diffuser material is equal to the distance between the substrates and the tray—in other words, there is no distance between the tray and the diffuser material.

Figure 4E:
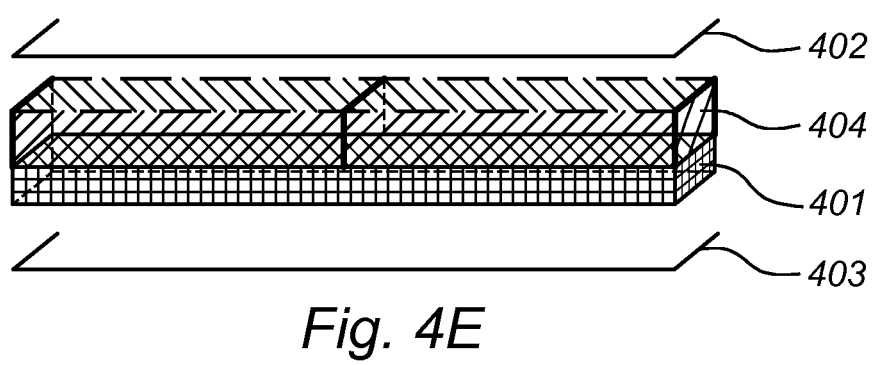

For substrates that are higher than the height of the tray 401, a frame may be constructed to generate a certain distance between the substrates and the top side 407 of the plasma diffuser 404. For the other diffuser sides 406, 407, 408, 409 and 410, the tray may be used as frame. This is represented in FIG. 4E.

Other variations may as well be considered, e.g. the sides 409 and 410 are positioned in between the tray 401 and the side walls. The choice whether the tray is used as frame for one or more sides depends on the substrates to be treated, their shape, dimensions and composition, their positioning, as well as the design of the plasma chamber and the trays.

Although it is preferred to apply plasma diffuser material between the substrate(s) and the RF electrode, in some cases, especially when the coating thickness is key, it may be considered not to apply a diffuser material between the substrate(s) and the RF electrode, but elsewhere. When plasma treating, e.g. plasma coating, electronic components, subassemblies, assemblies or devices, it is preferred to use a horizontal set-up where the electronic components, subassemblies, assemblies or devices are placed onto a tray. For coating deposition onto such substrates, it may be advantageous not to diffuse the plasma between the tray containing the substrates, and the RF electrode, in order to guarantee a certain coating thickness. However, preferably a plasma diffuser is used at selected surfaces of the tray—which is so-called "selective plasma diffusion".

Figure 4F:
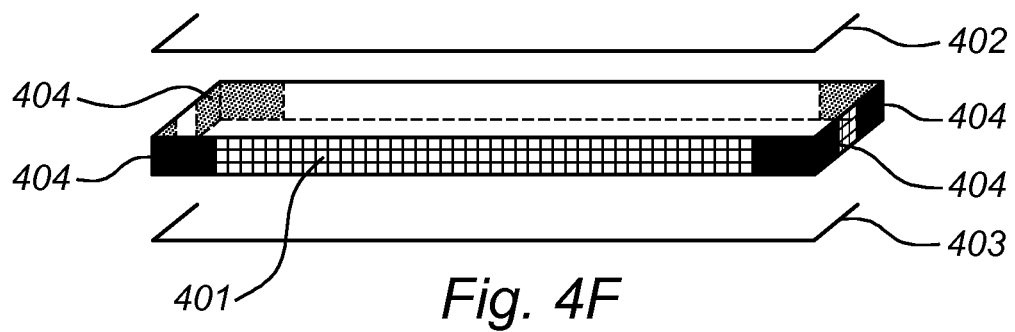

FIG. 4F shows a schematic representation of a possible selective plasma diffuser. The plasma diffuser material is placed in a colloidal shape having no top side and no bottom side, and a reduced area of diffusion for the other four sides (front, back, left, right). The degree of selective diffusion—thus how much diffuser material is taken away—depends on the substrates to be treated, its dimensions, shape, materials, composition, and on the process parameters, on the set-up of the plasma chamber, etc. FIG. 4F uses a selective plasma diffuser which is mounted in the four corners of the tray only, in order to diffuse the plasma at the corners of the trays, where typically a higher plasma density is noticed, leading to more discolouration.

For the embodiments of FIGS. 4B to 4E, a way to ease the opening of the diffuser may be foreseen, e.g. a zip, buttons, Velcro, or adhesive tape.

For the embodiments of FIGS. 4A to 4C, the diffuser may have a fixed position in the plasma chamber by means of a frame that has a fixed position inside the plasma chamber. In between two batches the diffuser is opened (FIGS. 4B to 4E only), and the trays 401 can be taken out, emptied, refilled and placed in the plasma chamber.

Alternatively, the tray is partially or completely used as frame for the plasma diffuser, the plasma diffuser 404 will be taken out of the plasma chamber together with the tray 401 in between two processes. Next, the treated substrates are taken out of the tray, through one or more sides without diffuser material (e.g. the front side of FIG. 4A), or by opening the diffuser by means of for example a zip, buttons, Velcro, or adhesive tape.

FIG. 5A shows a plasma diffuser for a vertical electrode set-up. This plasma diffuser may be generated from the plasma diffuser showed in FIG. 3H. The substrate or substrates 501 to be treated are placed within the slot marked by RF electrode 502 and M electrode 503. A plasma diffuser 504 is constructed around substrate(s) 501, and comprises a left side 505 placed between substrate(s) 501 and the RF electrode 502, a right side 506 placed between substrate(s) 501 and the M electrode 503 (which is thus equal to the diffuser of FIG. 3H), and comprises a back side 507 as well. The back side 507 is perpendicular to the plane of the electrodes 502 and 503, and connects the left side 405 and the right side 406. The front side remains open, which allows the easy positioning of the substrate or substrates in the slot.

Sides 505 and 506 of the plasma diffuser 504 are placed at a certain distance between the substrate(s) and the electrodes, and side 507 is placed at a certain distance between the substrate(s) 501 and the back wall of the plasma chamber. In this embodiment, a frame may be used to keep the diffuser material in place, but the plasma diffuser 504 may as well be attached to the top side of the plasma chamber without a frame to be required to keep the plasma diffuser in place, since the diffuser material is hanging.

In another embodiment, the plasma diffuser has no back side but a front side.

In yet another embodiment, represented by FIG. 5B, the plasma diffuser 504 is constructed again around substrate(s) 501, and both the plasma diffuser 504 and the substrate(s) 501 are placed between a RF electrode 502 and a M electrode 503. The plasma diffuser 504 has a left side 505, a right side 506, a back side 507 and a front side 508. Only the top and the bottom plane are not filled with any diffuser material. This embodiment may be used to diffuse the plasma away from the electrodes, while at the same time easy entrance of precursor molecules in the area between the plasma diffuser and the substrate(s) is made possible. Sides 505 and 506 of the plasma diffuser 504 are placed at a certain distance between the substrate(s) 501 and the electrodes, side 507 is placed at a certain distance between the substrate(s) 501 and the back wall of the plasma chamber, and side 508 is placed at a certain distance between substrate(s) 501 and the front wall of the plasma chamber. In this embodiment, a frame may be used to keep the diffuser material in place, but it is not necessary since the diffuser material has a hanging position and keeps itself in shape and place.

FIG. 5C shows the plasma diffuser of FIG. 5B, where now as well the top side 509 and the bottom side 510 are filled with plasma diffuser material. The plasma diffuser is now a colloidal shape having 6 sides (all sides) filled with plasma diffuser material. Sides 505 and 506 of the plasma diffuser 504 are placed at a certain distance between the substrate(s) and the electrodes, side 507 is placed at a certain distance between the substrate(s) and the back wall of the plasma chamber, side 508 is placed at a certain distance between substrate(s) 501 and the front wall of the plasma chamber, side 509 is placed at a certain distance between substrate(s) 501 and the top wall of the chamber, and side 510 is placed at a certain distance between substrate(s) 501 and the bottom wall of the plasma chamber. In this embodiment, a frame may be used to keep the diffuser material in place, but it is not necessary since the diffuser material has a hanging position and keeps itself in shape and place.

For the embodiments of FIGS. 5B and 5C, a way to ease the opening of the diffuser may be foreseen, e.g. a zip, buttons, Velcro, or adhesive tape.

For the embodiments of FIGS. 5A to 5C, the diffuser may have a fixed position in the plasma chamber by means of a frame that has a fixed position inside the plasma chamber. In between two batches the diffuser is opened (FIGS. 5B and 5C only), and the substrate(s) 501 can be taken out, and new substrate(s) can be placed in the plasma chamber inside the plasma diffuser.

Alternatively, the plasma diffuser 504 can be positioned in a way that it can be taken out of the plasma chamber when required.

Preferably, for the embodiments represented schematically by FIGS. 5A to 5C, the distance between the substrates placed inside the plasma diffuser and the diffuser material of the plasma diffuser is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the sides of the plasma diffuser parallel to the electrodes of the plasma chamber and the electrodes is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

Preferably, the distance between the sides of the plasma diffuser perpendicular to the plane of the electrodes and the walls of the plasma chamber parallel to said sides of the plasma diffuser is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

Another shape of 3D-plasma diffuser is the cylindrical shape. A sheet of diffuser material is folded so that a tubular shape is obtained by connecting for example the left and the right side of the sheet of diffuser material to each other.

Figure 6A:
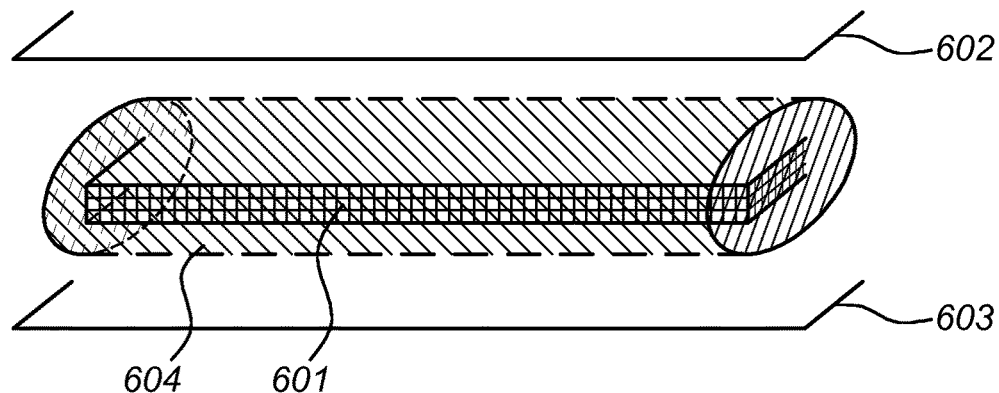

FIG. 6A shows how a cylindrical plasma diffuser 604 may be used around a tray 601 in a horizontal set-up. A certain distance between the plasma diffuser material 604 and the tray 601 is maintained. The plasma diffuser 604 fits in the space between the horizontally positioned RF electrode 602 and M electrode 603. The left side and the right side of the plasma diffuser are open to allow precursor molecules to enter the space between the diffuser and the substrate or substrates, positioned in tray 601, in a controlled manner. A zipper, buttons, Velcro strips or tape may be foreseen to allow easy opening of the plasma diffuser. The plasma diffuser is preferable mounted onto a frame, and may have a fixed position in the plasma chamber, or may be taken out together with the tray after each process.

Figure 6B:
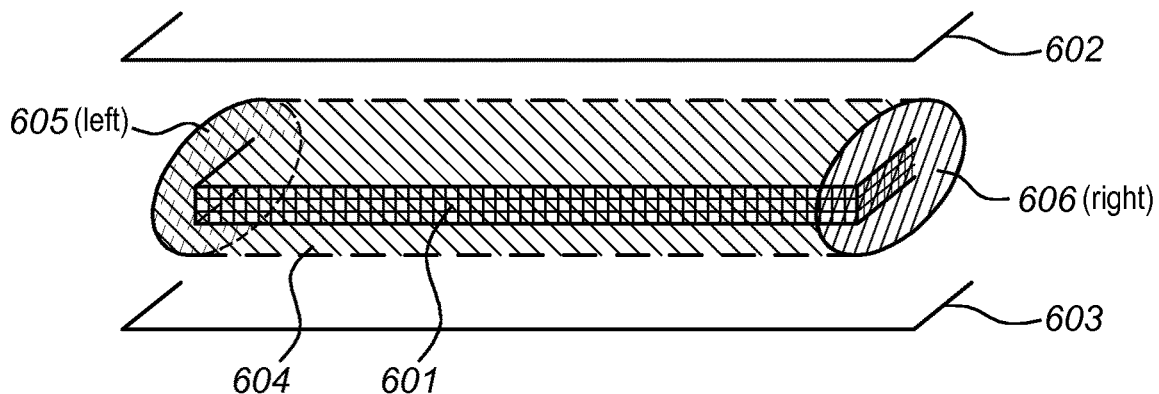

FIG. 6B shows the plasma diffuser of FIG. 6A, wherein now the left side 605 and the right side 606 are filled with diffuser material as well. Substrate tray 601 is positioned in the inner volume of the plasma diffuser 604. The plasma diffuser 604 is positioned between the RF electrode 602 and the M electrode 603. A zipper, buttons, Velcro strips or tape may be foreseen to allow easy opening of the plasma diffuser. The plasma diffuser is preferable mounted onto a frame, and may have a fixed position in the plasma chamber, or may be taken out together with the tray after each process.

Although the cylindrical shape may be used for horizontal set-up of the plasma chamber (horizontally positioned electrodes), preferably a colloidal plasma diffuser is used for horizontal position. The cylindrical plasma diffuser is well suited for use in vertical set-up of the electrodes, since the sheet of diffuser material can be wrapped easily around the substrates which are hanging in the plasma chamber.

Figure 6C:
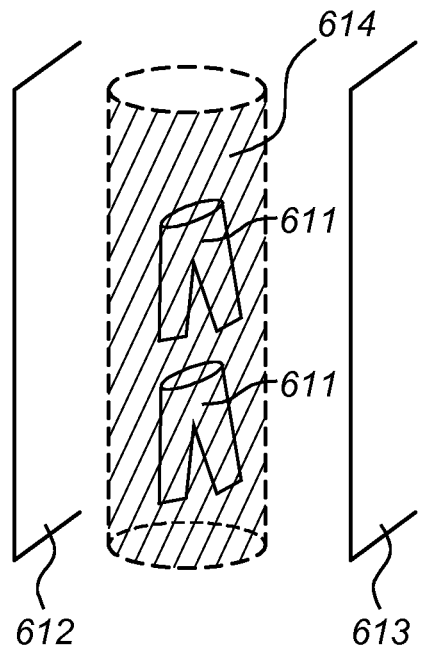

FIG. 6C shows a schematic representation of a cylindrical plasma diffuser 614, wrapped around one or more substrates 611, and positioned within the slot marked by the vertically positioned RF electrode 612 and M electrode 613. The top side and bottom side of the plasma diffuser 614 are open to allow precursor molecules to enter the space between the diffuser and the substrate or substrates in a controlled manner. A zipper, buttons, Velcro strips or tape may be foreseen to allow easy opening of the plasma diffuser. The plasma diffuser may be mounted onto a frame but can be used without a frame as well, but attaching it to the top side of the plasma chamber. The plasma diffuser 614 may have a fixed position in the plasma chamber, or may be taken out together with the substrate(s) after each process.

Figure 6D:
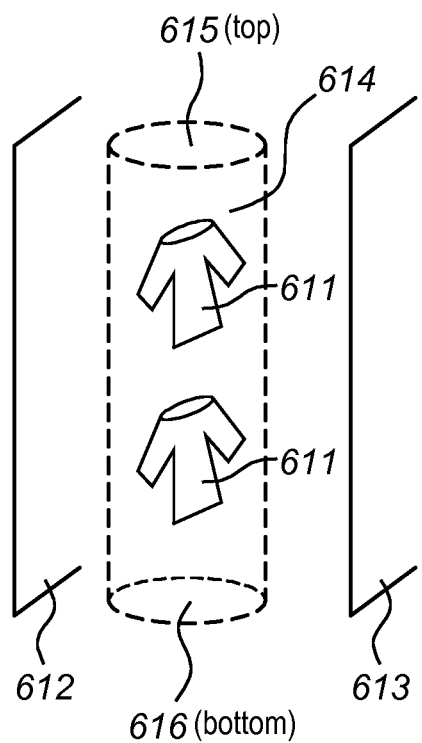

FIG. 6D shows a schematic representation of a cylindrical plasma diffuser 614, wrapped around one or more substrates 611, and positioned within the slot marked by the vertically positioned RF electrode 612 and M electrode 613. The top side 615 and bottom side 616 of the plasma diffuser 614 are filled with diffuser material as well. A zipper, buttons, Velcro strips or tape may be foreseen to allow easy opening of the plasma diffuser. The plasma diffuser may be mounted onto a frame but can be used without a frame as well, but attaching it to the top side of the plasma chamber. The plasma diffuser 614 may have a fixed position in the plasma chamber, or may be taken out together with the substrate(s) after each process.

Preferably, for the embodiments represented schematically by FIGS. 6A to 6D, the distance between the substrates placed inside the plasma diffuser and the diffuser material of the plasma diffuser is not the same at any point because of the curved shape of the plasma diffuser material, and is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the sides of the plasma diffuser and the electrodes and/or the plasma chamber walls is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm. Since the plasma diffuser material has not a planar shape at any point, the distance may vary from one point to another.

3D-plasma diffusers having a shape other than colloidal and cylindrical may also be used when considered to be better. FIGS. 7A, 7B, 8, 9A and 9B give some schematic representations, but it is clear that also variations on these shapes may be envisaged.

FIG. 7A shows a plasma diffuser 704 having a shape that represents half a sphere.

Preferably this plasma diffuser is used for the horizontal set-up, as shown in this schematic representation. The plasma diffuser 704 is placed on top of tray 701, which is mounted between RF electrode 702 and M electrode 703. Preferably, a frame is used to keep the plasma diffuser in place. The bottom side of the tray 701 may be covered with diffuser material as well, but in some cases it is not advised to do so. Whether the bottom of tray 701 is covered or not, depends on the set-up, the substrates to be treated, etc.

FIG. 7B shows a plasma diffuser 704 having a spherical shape around tray 701. Preferably this plasma diffuser is used for the horizontal set-up, as shown in this schematic representation. Tray 701 is placed within the plasma diffuser 704, which is in its turn placed between the RF electrode 702 and the M electrode 703. Preferably, a frame is used to keep the plasma diffuser in place.

Referring to FIGS. 7A and 7B, a zipper, buttons, Velcro strips or tape may be foreseen to allow easy opening of the plasma diffuser. Preferably, the plasma diffuser 704 is taken out of the plasma chamber after each process, together with tray 701, and is then opened to remove the treated substrates from tray 701. Tray 701 is then filled again with substrates to be treated, the plasma diffuser 704 is closed, and is placed, together with tray 701, back into the plasma chamber.

Preferably, the distance between the substrates placed inside the plasma diffuser and the plasma diffuser material is not a constant value due to the curved shape of the plasma diffuser, and is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the plasma diffuser material and the electrodes and/or the plasma chamber walls is not constant due to the curved shape of the plasma diffuser, and is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

FIG. 8 shows a plasma diffuser 804 having a shape that represents a dome. Preferably this plasma diffuser is used for the horizontal set-up, as shown in this schematic representation. The plasma diffuser 804 is placed on top of tray 801, which is mounted between RF electrode 802 and M electrode 803. Preferably, a frame 805 is used to keep the plasma diffuser in place. The bottom side of the tray 801 may be covered with diffuser material as well, but in some cases it is not advised to do so. Whether the bottom of tray 801 is covered or not, depends on the set-up, the substrates to be treated, etc.

Preferably, the distance between the substrates placed inside the plasma diffuser and the plasma diffuser material is not a constant value due to the curved shape of the plasma diffuser, and is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the plasma diffuser material and the electrodes and/or the plasma chamber walls is not constant due to the curved shape of the plasma diffuser, and is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

FIGS. 9A and 9B show a plasma diffuser 904 having a shape that represents a tunnel. The radius of curvature may vary depending on the dimensions of the substrates to be treated.

Preferably this plasma diffuser is used for the horizontal set-up, as shown in this schematic representation. The plasma diffuser 904 is placed on top of tray 901, which is mounted between RF electrode 902 and M electrode 903. Preferably, a frame 905 is used to keep the plasma diffuser in place. The bottom side of the tray 901 may be covered with diffuser material as well, but in some cases it is not advised to do so. Whether the bottom of tray 901 is covered or not, depends on the set-up, the substrates to be treated, etc.

Preferably, the distance between the substrates placed inside the plasma diffuser and the plasma diffuser material is not a constant value due to the curved shape of the plasma diffuser, and is from 1 mm to 150 mm, more preferably from 2 mm to 100 mm, such as 5 mm to 75 mm, more preferably from 10 mm to 50 mm, such as 50, 45, 40, 39, 38, 37, 36, 35, 34, 33, 32, 31, 30, 29, 28, 27, 26, 25, 24, 23, 22, 21, 20, 19, 18, 17, 16, 15, 14, 13, 12, 11, or 10 mm.

Preferably, the distance between the plasma diffuser material and the electrodes and/or the plasma chamber walls is not constant due to the curved shape of the plasma diffuser, and is from 5 mm to 250 mm, more preferably from 10 mm to 200 mm, such as 15 mm to 150 mm, such as 150, 145, 140, 135, 130, 125, 120, 115, 110, 105, 100, 95, 90, 85, 80, 75, 70, 65, 60, 55, 50, 45, 40, 35, 30, 25, 20, or 15 mm.

Advantages of the present invention are: reduction, even elimination, of unwanted discolouration effects typically visible on dark coloured surfaces—such as dark green, dark blue, dark grey and black objects—or on substrates having a high gloss surface or a low surface roughness (e.g. soft feel surfaces or polished surfaces); versatile set-up of the plasma diffuser in function of the dimensions of the substrates to be treated or by the required discolouration reduction, by varying the plasma diffuser material, the shape of the plasma diffuser, the number of sides that are filled with diffuser material, or the degree of diffusion (selective plasma diffusion) by using multiple layers of diffuser material or by partly removing the diffuser material from a side; no impact on water contact angle, spray testing, oil level; no impact on washing properties; no need to adapt machine design; easy implementation in existing plasma chambers; easy handling by using fixed position or removable position inside the plasma chamber, and by using fixation means that allow easy opening of the plasma diffuser.

The present invention will now be illustrated and further described by means of the examples below. These examples are given here for reference only and imply no restriction on the above-mentioned aspects of the present invention.

EXAMPLES

Example 1

Example 1 demonstrates the impact of the openness of the material from which the plasma diffuser is made. Three different diffuser materials have been used: a non-woven, a woven fabric and a foil. All three materials were used in the same horizontal set-up as represented by FIG. 4E but with open left and right side, which are parallel to the walls of the chamber where the monomer inlets are positioned. The non-woven was used in single layer and double layer set-up. With each plasma diffuser the same plasma polymerisation process was performed in a 490 l large plasma chamber, according to Table 1:

TABLE 1

Process parameters according to Example 1

| Parameter | Value |
| --- | --- |
| Monomer | 1H,1H,2H,2H-heptadecafluorodecyl acrylate |
| Time | 10 minutes |
| Electrodes | Primary - RF/M |
| Flow | 40 sccm |
| Base Pressure | 20 mTorr |
| Work Pressure | 40 mTorr |
| Power | 50 W |
| Power Mode | Continuous wave |
| Frequency | 13.56 MHz |

The data and results are presented in Table 2:

TABLE 2

Overview testing done with four different plasma diffuser materials

| Material | — | Non-woven Single layer | Non-woven Double layer | Woven | Foil |
| --- | --- | --- | --- | --- | --- |
| Weight (g/m$^2$) | — | 50 g/m$^2$ | 100 g/m$^2$ | 120 g/m$^2$ | 25 g/m$^2$ |
| Number of open sides | 6 sides (all) 100% open | 2 sides (left + right) 100% open | 2 sides (left + right) 100% open | 2 sides (left + right) 100% open | 2 sides (left + right) 100% open |
| Reduction in discolouration (%) | 0% | 75-90% | 90-100% | 100% | 100% |
| Oil level woven | Level 7 | Level 7 | Level 7 | Level 7 | Level 7 |
| Oil level non-woven | Level 8 | Level 8 | Level 8 | Level 8 | Level 8 |
| Thickness (nm) | 263.8 nm | 123.4 nm | 131.6 nm | 138.0 nm | 141.5 nm |

From Table 2 it is clear that the less open the fabric is (single layer non-woven→double layer non-woven→woven→foil), the better the reduction in discolouration is, while at the same moment the coating thickness is not negatively influenced from one diffuser material to another. However, the coating thickness of the processes with plasma diffuser is for all four plasma diffusers lower than for the process without plasma diffuser.

The test with the double layer and single layer non-woven show clearly that better discolouration reduction is obtained with the double layer.

Example 2

Example 2 demonstrates the impact of the openness of the two sides parallel to the walls wherein the monomer inlets are installed. The single layer non-woven plasma diffuser of Example 1 has been used, with 100% open left and right sides, and now as well with sides that are open for only 25%. The processes are performed according to the parameters of Table 1. The results can be found in Table 3:

TABLE 3

Overview testing done with four different plasma diffuser materials

| Material | Non-woven Single layer | Non-woven Single layer |
| --- | --- | --- |
| Weight (g/m²) | 50 g/m² | 100 g/m² |
| Open sides | 2 sides 20% open | 2 sides 100% open |
| Reduction in discolouration (%) | 90-100% | 75-90% |
| Oil level woven | Level 7 | Level 7 |
| Oil level non-woven | Level 8 | Level 8 |
| Thickness (nm) | 32.1 nm | 123.4 nm |

From Table 3 it is clear that less open sides have a positive impact on the reduction of the discolouration, and the oil level is not influenced. However, the coatings that are deposited using this plasma diffuser are much thinner, which can explain the absence of the discolouration. In cases where the criteria to meet are a certain oil repellency level, this more closed plasma diffuser may be considered.

But in the situations where a combination of minimal coating thickness and reduction of discolouration are required, it is better to use a less open diffuser material with two sides that are 100% open—see Example 1.

Example 3

Example 3 demonstrates the fact that the washing performance of the samples is not influenced by using the plasma diffuser. Woven textile samples made of 100% recycled PES, were hung vertically in the plasma diffuser. The top and bottom sides, which are parallel to the walls where the monomer inlets are positioned, are 100% open. A process of 5 minutes pre-treatment and 10 minutes coating was carried out on the textile samples, which have been coated without and with the plasma diffuser. The process parameters used to carry out the coating processes are given in Table 4.

TABLE 4

Process parameters according to Example 3

| Parameter | Value pre-treatment | Value coating step |
| --- | --- | --- |
| Monomer/Gas | Argon | 1H,1H,2H,2H-tridecafluorooctyl acrylate |

TABLE 4-continued

Process parameters according to Example 3

| Parameter | Value pre-treatment | Value coating step |
| --- | --- | --- |
| Time | 5 minutes | 10 minutes |
| Electrodes | Primary - RF/M | Primary - RF/M |
| Flow | 1000 sccm | 40 sccm |
| Base Pressure | 50 mTorr | 15 mTorr |
| Work Pressure | 200 mTorr | 20 mTorr |
| Power | 600 W | 100 W |
| Power Mode | Continuous wave | Continuous wave |
| Frequency | 13.56 MHz | 13.56 MHz |

The coated textiles have been washed industrially according to ISO 15797 (2002). One complete washing cycle comprised the following steps:
1. Washing at 75° C. and using 20 g IPSO HF 234 without optical whitener per kilogram dry textile material;
2. Drying in a drying cabinet;

After one washing cycle a spray test was performed according to ISO 9073—part 17 and ISO 4920. Next, four more washing cycles have been completed and the oil repellency test and spray test have been repeated (values measured after 5 washings).

FIG. 10 shows it is clear that there was no difference noticed in the spray results coming from samples treated within the plasma diffuser and those coated without plasma diffuser.

Example 4

A selective plasma diffuser according to FIG. 4F has been used in a 490 litres chamber having 5 trays. The diffuser material, in this example Teflon, was placed in all four corners of all five trays, over lengths of 20 cm. A second diffuser was created by placing diffuser material, again Teflon, in all four corners of all five trays, over lengths of 10 cm. The process parameters are presented in Table 6. The same process was performed without plasma diffuser as well.

The objective of this test was to check whether the discolouration on printed circuit boards (PCBs) could be reduced, as well as if the uniformity of the coating thickness could be improved. The results are presented in Table 7.

TABLE 6

Process parameters according to Example 4

| Parameter | Value |
| --- | --- |
| Monomer | 1H,1H,2H,2H-heptadecafluorodecyl acrylate |
| Time | 45 minutes |
| Electrodes | RF/M |
| Flow | 40 sccm |
| Base Pressure | 15 mTorr |
| Work Pressure | 20 mTorr |
| Power | 40 W |
| Power Mode | Continuous wave |
| Frequency | 13.56 MHz |

It is clear from Table 7 that for all trays, except for the fifth tray (lowest positioned tray), the plasma diffuser highly reduces the StDev (%), hence leading to a better uniformity of the thickness. It is to be noted that for all trays the coating thickness with the plasma diffuser is lower, as became clear from examples 1 and 2.

TABLE 7

Thickness and standard deviation (%) for different set-ups

| Tray n° | Without plasma diffuser | | With plasma diffuser | |
|---|---|---|---|---|
| | Thickness (nm) | StDev. (%) | Thickness (nm) | StDev. (%) |
| Tray 1 | 331.3 nm | 66.5% | 183.1 nm | 10.0% |
| Tray 2 | 491.8 nm | 27.7% | 305.5 nm | 18.0% |
| Tray 3 | 480.1 nm | 60.8% | 356.1 nm | 30.5% |
| Tray 4 | 572.2 nm | 32.4% | 354.7 nm | 17.8% |
| Tray 5 | 410.5 nm | 26.9% | 187.1 nm | 31.0% |

The invention claimed is:

1. Method comprising at least partially preventing discolouration of a substrate by a plasma coating process, by diffusing a plasma with a plasma diffuser prior to and/or during depositing of said plasma on said substrate at a work pressure greater than 5 mTorr to less than 1000 mTorr to form a coating, wherein the plasma diffuser comprises a plasma diffuser material comprising an open cell structure, wherein the plasma diffuser material is in the form of a sheet.

2. Method according to claim 1, wherein said substrate is pre-treated by a pre-treatment plasma, wherein said pre-treatment plasma is diffused with a plasma diffuser prior to and/or during reaction of said pre-treatment plasma with said substrate.

3. Method according to claim 1, wherein said plasma comprises monomers and wherein said coating is a polymer coating.

4. Method according to claim 1, wherein the coating performance in terms of oil repellency, spray test and wash-ability is not negatively influenced.

5. Method according to claim 1, whereby said substrate is coated in a plasma coating apparatus comprising a plasma chamber which comprises a grounded (M) electrode, a radiofrequency (RF) electrode and said plasma diffuser comprising one or more plasma diffuser materials positioned between said electrodes, for homogenizing a plasma density proximal said substrate to reduce discolouration of said substrate after processing.

6. Method according to claim 5, wherein one or a combination of the following features is present:
plasma diffuser material is placed between the substrate or substrates to be coated and the radiofrequency electrode;
plasma diffuser material is placed between the substrate or substrates to be coated and the grounded electrode;
plasma diffuser material is placed between the substrate or substrate to be coated and the grounded electrode, and between the substrate or substrates to be coated and the radiofrequency electrode;
plasma diffuser material is placed at least at one more side of the substrate, facing a wall of the plasma chamber so as to form a colloidal plasma diffuser; and/or
a sheet of plasma diffuser material is wrapped cylindrically around the substrate or substrates to be coated.

7. Method according to claim 5, wherein the plasma diffuser materials are in a form of a sheet, said sheet having a shape selected from flat, curved or folded.

8. Method according to claim 1, wherein the formed coating has a uniform thickness.

9. Method for pre-treating a substrate by a pre-treatment plasma prior to applying a method according to claim 1, by diffusing said pre-treatment plasma with a plasma diffuser prior to and/or during reaction of said pre-treatment plasma with said substrate.

10. Method according to claim 1, further comprising using plasma coating apparatus for applying a plasma coating to a substrate, said apparatus arranged for at least partially preventing discolouration of the substrate by application of the plasma coating, said apparatus comprising a plasma chamber which comprises a grounded (M) electrode, a radiofrequency (RF) electrode and a plasma diffuser for homogenizing a plasma density nearby said substrate, said plasma diffuser positioned between said electrodes, wherein the plasma diffuser is placed in the plasma chamber without the use of a frame or with support of a frame, and wherein the plasma diffuser comprises a plasma diffuser material comprising an open cell structure, wherein the plasma diffuser material is in the form of a sheet, wherein the apparatus arranged for diffusing a plasma with said plasma diffuser prior to and/or during depositing of said plasma on said substrate at a work pressure greater than 5 mTorr to less than 1000 mTorr to form a coating.

11. Method according to claim 10, wherein the plasma diffuser material comprises an open cell polymer structure, and/or an open cell metal structure, such as a mesh structure.

12. Method according to claim 10, wherein the plasma diffuser comprises opening means.

13. Method according to claim 10, wherein said plasma coating is a plasma polymer coating.

14. Method according to claim 1, wherein said coating is a halogen containing polymer coating to impart hydrophobic and/or oleophobic properties to the substrate.

15. Method according to claim 1, wherein the plasma is provided at a work pressure from 10 mTorr to 500 mTorr.

16. Method according to claim 1, wherein the plasma diffuser material comprises an open cell polymer structure.

17. Method according to claim 1, wherein the plasma diffuser material comprises an open cell metal structure.

* * * * *